(12) United States Patent
Hoerold

(10) Patent No.: US 7,565,638 B2
(45) Date of Patent: Jul. 21, 2009

(54) DENSITY-BASED LAYER FILLER FOR INTEGRATED CIRCUIT DESIGN

(75) Inventor: Stephan Hoerold, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 272 days.

(21) Appl. No.: 11/562,301

(22) Filed: Nov. 21, 2006

(65) Prior Publication Data

US 2008/0120586 A1 May 22, 2008

(51) Int. Cl.
*G06F 17/50* (2006.01)
(52) U.S. Cl. ............................... 716/18; 716/9; 716/11; 716/12
(58) Field of Classification Search ...................... 716/4, 716/11, 12, 19, 9, 18
See application file for complete search history.

(56) References Cited

U.S. PATENT DOCUMENTS

| | | | |
|---|---|---|---|
| 6,093,631 A | 7/2000 | Jaso et al. | |
| 7,037,820 B2 | 5/2006 | Booth et al. | |
| 7,071,074 B2 | 7/2006 | Schmidt et al. | |
| 7,124,386 B2 * | 10/2006 | Smith et al. | 716/10 |

* cited by examiner

*Primary Examiner*—Thuan Do
(74) *Attorney, Agent, or Firm*—Robert C. Kowert; Meyertons, Hood, Kivlin, Kowert & Goetzel, P.C.

(57) ABSTRACT

A system and method for performing density-based layer filling on a design layout encoding of an integrated circuit device is disclosed. In some embodiments, the density-based layer filler may identify open areas on a given design layer in which one or more minimum density rules are not met and may insert dummy shapes only in those identified areas. The dummy shapes may be constructed so as not to violate one or more other design rules. The density-based layer filler may access a configuration file comprising layer density rules and other design rules and may generate a run deck dependent on the contents of the configuration file. The density-based layer filler may be applied iteratively to a design in checking windows of various sizes according to multiple window sizes and step values specified in the configuration file. The dummy shapes may be electrically connected to an existing ground wire after insertion.

20 Claims, 16 Drawing Sheets

```
...
<boundaryLPP> ::= (<layerName> <layerPurposeName>)
<densityAndMetalFillRules> ::= (nil
                                DENSITY <densityDefinitions>
                                RULES <metalFillRules>
                                )
<densityDefinitions> ::= (
                        (<layerDensities1>)
                        (<layerDensities2>)
                        ...
                        (<layerDensitiesN>)
                        )
<layerDensities> ::= ( <metalLayer>
                        (
                        <densityAndWindowSettings1>
                        <densityAndWindowSettings2>
                        ...
                        <densityAndWindowSettingsN>
                        )
                    )
<layerDensity> ::=
        (<densityValue> <windowSizeX> <windowSizeY> <stepX> <stepY>)
<metalFillRules> ::= (
                        (<layerRules1>)
                        (<layerRules2>)
                        ...
                        (<layerRulesN>)
                        )
<layerRules> ::= (<metalLayer>
                        (
                        <routingDirection>
                        <widestMetalMinSpacing>
                        <lowerViaMinMetal>
                        <upperViaMinMetal>
                        <minMetalArea>
                        <minMetalSpacing>
                        <lowerViaSquareSize>
                        <lowerViaSpacing>
                        <lowerMinMetalSizeForViaEnclosure>
                        <lowerMetalWideIntersectionRules>
                        <upperViaSquareSize>
                        <upperViaSpacing>
                        <upperMinMetalSizeForViaEnclosure>
                        <upperMetalWideIntersectionRules>
                        <metalGDSLayerNumber>
                        <lowerViaGDSLayerNumber>
                        <upperViaGDSLayerNumber>
                        )
                    )
```

*FIG. 10A*

```
...
boundaryLPP ("boundary" "drawing")
...
rules (nil
        DENSITY (
                (m1     ((0.20 100.0 100.0 10.0 10.0)
                        (0.25 500.0 500.0 25.0 25.0)
                        (0.30 2000.0 2000.0 100.0 100.0)))
                (m2     ((0.20 100.0 100.0 10.0 10.0)
                        (0.25 500.0 500.0 25.0 25.0)
                        (0.30 2000.0 2000.0 100.0 100.0)))
                (m3     ((0.25 100.0 100.0 10.0 10.0)
                        (0.30 500.0 500.0 25.0 25.0)
                        (0.35 2000.0 2000.0 100.0 100.0)))
        )

RULES (
                (m1 (h 0.50 nil 0.20 0.50 0.15 nil nil nil nil 0.15 0.15 0.05 (0.50 0.05 0.15) 21 nil 41))
                (m2 (v 0.50 0.20 0.20 0.050 0.15 0.15 0.15 0.05 (0.50 0.05 0.15) 0.15 0.15 0.05 (0.50
                        0.10 0.15) 22 41 42))
                (m3 (h 0.50 0.20 0.30 0.050 0.20 0.15 0.15 0.05 (0.55 0.06 0.20) 0.20 0.20 0.05
                        (0.60 0.10 0.20) 23 42 43))
                )
)
```

*FIG. 10B*

DENSITY-BASED LAYER FILLER FOR INTEGRATED CIRCUIT DESIGN

BACKGROUND OF THE INVENTION

1. Field of the Invention

This invention relates to integrated circuit design and more specifically to computer aided design layout and ensuring compliance with layer-density rules in a design layout in preparation for fabrication.

2. Description of the Relevant Art

Design of an electronic circuit, for example, an integrated circuit (IC), is a complicated and time-consuming process. FIG. 1 illustrates a typical design flow of an integrated circuit device from conception through the generation of a fabrication ready design layout. Generally, the design flow commences with defining the design specifications or requirements, such as required functionality and timing, as indicated at 110. The requirements of the design are implemented, for example, as a net-list or electronic circuit description, as indicated at 120. The implementation can be performed by, for example, schematic capture (drawing the design with a computer aided design tool) or more typically, utilizing a high-level description language such as VHDL, Verilog and the like. The implemented design may be simulated to verify design accuracy, as indicated at 130. Design implementation and simulation may be iterative processes. For example, errors found by simulation may be corrected by design implementation and re-simulated.

Once the design is verified for accuracy through simulation, a design layout is created, as indicated at 140. The design layout may describe the detailed design geometries and the relative positioning of each design layer to be used in actual fabrication of the electronic circuit and is typically implemented as one or more design files encoding representations of the layers and geometries. The design layout is typically very tightly linked to overall circuit performance (area, speed and power dissipation) because the physical structure defined by the design layout determines, for example, the transconductances of the transistors, the parasitic capacitances and resistances of the circuit, and the silicon area used to realize a certain function. The detailed design layout may require a very intensive and time-consuming design effort and is typically performed utilizing specialized computer aided design (CAD) or Electronic Design Automation (EDA) tools.

During creation of the design layout, a place and route tool is often used to place geometries on various layers of the design layout and to connect or route the cells together. In modern semiconductor design technologies, many metal layers are used to implement interconnections throughout an integrated circuit. For some integrated circuits, one or more polysilicon (poly) layers, or even active areas, are also used to implement interconnections.

Once the design layout is created, it is checked against a set of design rules in a design rule check (DRC) operation, as indicated at 150. The created design layout typically must conform to a complex set of design rules in order, for example, to ensure a lower probability of fabrication defects. The design rules specify, for example, how far apart various geometries on different layers must be, or how large or small various aspects of the layout must be for successful fabrication, given the tolerances and other limitations of the fabrication process. Design rules are typically closely associated with the technology, fabrication process and design characteristics. For example, different minimum spacing amounts between geometries may be specified for different sizes of geometries, and a minimum or maximum density of a design layer for a given sized area may be specified. DRC may be a time-consuming, iterative process that often requires manual manipulation and interaction by the designer. The designer may perform design layout and DRC iteratively, reshaping and moving design geometries to correct all layout errors and achieve a DRC-clean (violation-free) design.

Circuit extraction is performed after the design layout is completed and error free, as illustrated at 160. The extracted circuit may identify individual transistors and interconnections, for example, on various layers, as well as the parasitic resistances and capacitances present between the layers. A layout versus schematic check (LVS) may be performed, as indicated at 170, in which the extracted net-list is compared to the design implementation created at 120. LVS may ensure that the design layout is a correct realization of the intended circuit topology. Any errors such as unintended connections between transistors, or missing connections/devices, etc., may be corrected in the design layout before proceeding to post-layout simulation, as indicated at 180. The post-layout simulation may be performed using the extracted net-list, which may provide an assessment of the circuit speed, the influence of circuit parasitics (such as parasitic capacitances and resistances), and any glitches that may occur due to signal delay mismatches. Once post-layout simulation is complete and errors found by LVS are corrected, the design may be ready for fabrication and may be sent to a fabrication facility As electronic circuit densities increase and technology advances, for example, in deep sub-micron circuits, skilled designers attempt to maximize the utilization of the design layout area and the manufacturability and reliability of the circuit. For example, to increase planarity in anticipation of chemical mechanical polishing of the metal layers while processing a wafer, open areas that exceed certain sizes may be filled with dummy metal beforehand, during chip design. A traditional metal fill tool uses a "flood fill" to fill the open areas with additional metal.

Deep sub-micron designs typically have stringent design rules that are often not recognized or not properly handled by existing EDA tools. Therefore, when creating a design layout at 140, for example, design rule violations may be created that must be corrected. For example, a tool that is used to flood fill a given area of the design with metal on a particular metal layer (e.g., in order to attempt to meet a layer density rule) may introduce other errors.

Because EDA tools are increasingly relied upon to create design layouts, and because conventional EDA tools do not prevent the creation of certain violations, thousands of violations can be created that must be corrected. Performing a DRC and manipulation of the design layout to correct these violations often requires manual interaction from the designer. Creation of a violation-free design layout becomes a critical, time-consuming process. Due to the complexity of the design and because the layout design flow can be repeated throughout the design process, manually fixing violations may not be an affordable approach.

SUMMARY

An automated technique may implement layer filling to avoid and/or correct design rule violations in a design layout of an integrated circuit device. In particular, violations of layer density rules, such as those specifying a minimum density of a metal layer or other design layer in a given area, may be corrected using a computer-implemented method for density-based layer filling, in some embodiments. In some embodiments, minimum density rule violations may be corrected without introducing additional design rule violations, such as violations of maximum density rules, spacing rules, and overlap rules.

Open areas on a design layer that exceed certain sizes may be filled with dummy metal before fabrication, e.g., during chip design. A traditional flood fill tool may be used to close the open areas with evenly distributed tracks, but may add more fill shapes than is necessary or desirable. For example, using a flood fill in some areas of the design may result in violations of a maximum density rule, or may introduce a violation of a complex spacing or overlap design rule. In some embodiments, a density-based layer filler may check for minimum density rule violations first and may fill only those areas that do not meet the minimum density requirements. In some embodiments, a density-based layer filler may be used to add fill shapes to one or more metal layers, and/or to one or more non-metal layers (e.g., polysilicon layers or nwell layers).

A design layout may be represented as a design encoding that is used in conjunction with design tools as part of the process leading to fabrication of the integrated circuit. In some embodiments, this design encoding (e.g., a GDSII file) may be input to the density-based layer filler along with an appropriate configuration file that describes the layer density requirements based on the design rules for the target process technology. The GDSII file may be processed by a design rule checker (DRC) to identify areas that do not meet minimum density requirements for a given layer, in some embodiments, and these areas may then be filled by adding dummy shapes, (e.g., dummy stripes) on the given layer. In some embodiments, electrical connections may be established between added fill shapes and adjacent, existing ground wires. In some embodiments, this may result in a design that does not contain floating features (e.g., floating metal). The density-based layer filler described herein may perform density checking and filling iteratively in different sized "checking windows" that define different sized portions of the design. In some embodiments, these checking windows may be stepped across the design according to step values specified in the configuration file.

The density-based layer filler described herein may in some embodiments be integrated into the overall integrated circuit design flow, or may be implemented as a stand-alone tool to be executed outside of, or in parallel with, the standard design flow. The use of a density-based layer filler, as described herein, may in some embodiments reduce the risk of process yield problems, as compared to a flood filler, since the number of dummy shapes added to a design may be minimized. Use of a density-based layer filler may also substantially reduce the layout database size (when compared to the layout database produced by a flood filler) and may improve the runtime of analysis tools that depend on complete designs (i.e. with fill shapes inserted), such as extraction and noise analysis tools. The time to insert fill shapes may also be reduced, as only the necessary number of shapes is inserted. Thus, a density-based layer filling tool may execute faster than a comparable flood filler.

BRIEF DESCRIPTION OF THE DRAWINGS

FIGS. 10A and 10B illustrate the definition and contents of various portions of an exemplary configuration file for a density-based layer filler, respectively, according to one embodiment.

Figure 1:
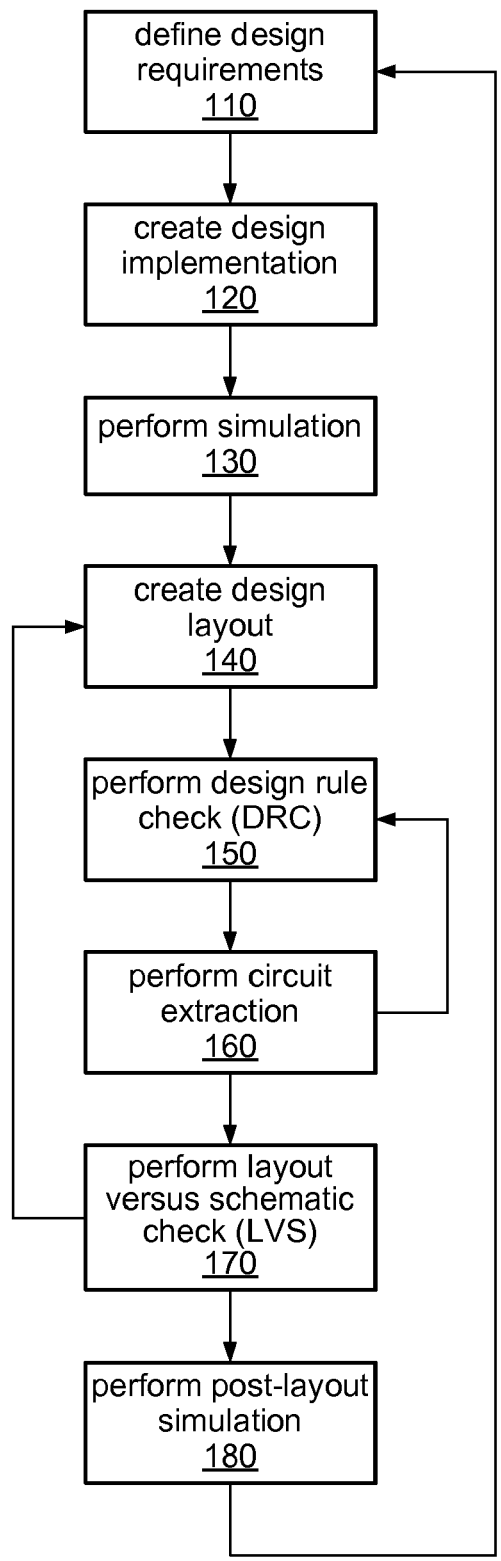
FIG. 1 illustrates an exemplary design flow for an integrated circuit device.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

In modern deep submicron processes, chemical-mechanical polishing (CMP) may be performed during wafer processing to achieve planarity (i.e., to smooth the upper surface of the wafer between some processing steps.) This polishing is most effective when the density of features on one or more layers in the area being polished is relatively uniform. For example, uneven erosion due to CMP may be avoided by distributing features as evenly as possible across the design, rather than by having some densely-populated regions and other sparsely-populated regions on the same die. In addition, delamination or lifting of metal during CMP may be avoided when metal density is relatively uniform across the area being polished.

For these and other reasons, deep submicron processes may include design rules specifying the minimum allowed density of a given design layer within a specified area of a design. The minimum density may be heavily dependent on the particular process technology (e.g., on the number and types of layers, the complexity, and the feature size) and/or on the limitations of the manufacturing process (e.g., the number and types of processing steps, the precision of the equipment being used, etc.).

An example of a minimum density rule for a given polysilicon layer may be 10% in any 100 micron×100 micron area of the design, for some technologies and fabrication processes. This means that the cumulative area of any shapes drawn on the given layer in any arbitrary region of this size must be equal to at least 10% of the total area of the region. In another example, the minimum metal density may be 30% of the area for a given region, using a similar window. In some technologies, the minimum density requirements for all layers of the same material (e.g., all metal layers) may be the same, while in others there may be different density requirements for one or more layers of the same type.

In some integrated circuit designs, the density of features drawn on a given design layer may not meet the minimum requirements. Therefore, "dummy" shapes may be added to the design during the design process. For example, any open area (i.e., any area that does not contain any shapes of a given layer) may be "filled" with these dummy shapes. These shapes may all be tied to a single potential (e.g., $V_{SS}$) and may (typically) implement no functionality. In a traditional integrated circuit design flow, any open area (or any open area exceeding a certain size) on a given layer may be filled with additional shapes in an attempt to meet minimum layer density rules. This is sometimes called a "flood fill."

Figure 2A:
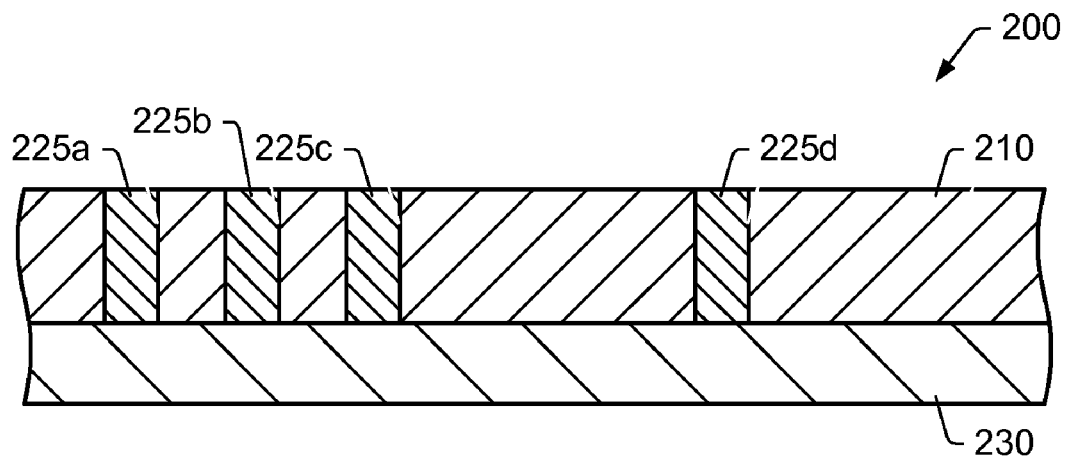
FIGS. 2A and 2B illustrate a portion of an integrated circuit in which layer density rules are not met, and a portion of the same circuit after filling, respectively.
Figure 2B:
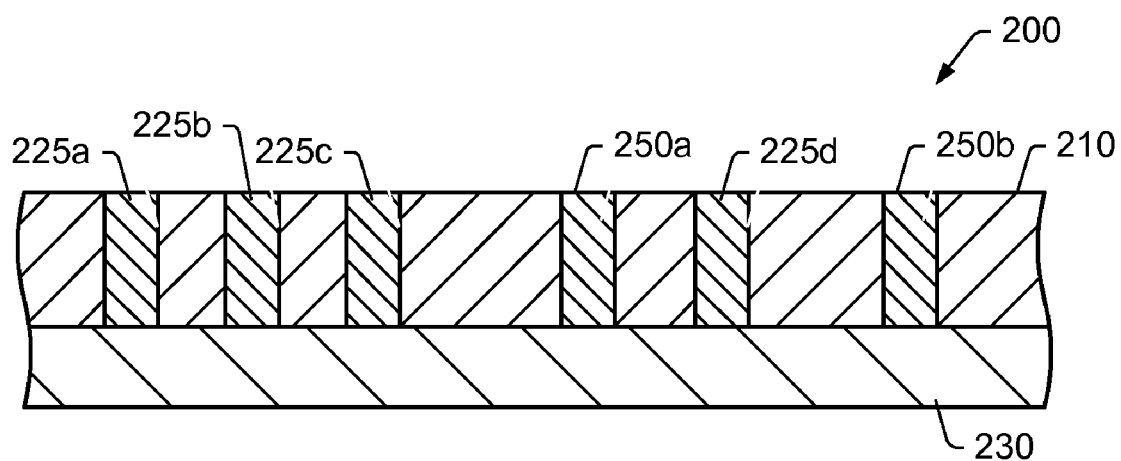

A traditional metal fill tool uses a flood fill to fill all of the open areas of a design layer with evenly distributed metal tracks, or stripes, regardless of whether or not minimum density rules are met. FIGS. 2A-2B and FIGS. 3A-3B illustrate the use of a flood filler, according to various embodiments. FIG. 2A, for example, illustrates a cross section of a portion of an integrated circuit 200 during fabrication. In this example, metal lines 225a-225d have been deposited in openings on a dielectric layer 210, above a silicon substrate 230. Metal lines 225a-225d may correspond to one of several metal layers of the circuit (e.g. metal 1). In this design, these metal lines are not evenly distributed across the portion of the circuit shown. Therefore, there are gaps (open areas) in which no metal is present on the given metal layer. The design may be modified using a flood filler, which may add metal stripes in the open areas of circuit 200, resulting in the cross section illustrated in FIG. 2B. As shown in FIG. 2B, metal lines 250a and 250b have been added to circuit 200. Note that in the cross-section view, it is not clear whether minimum metal density rules are met for this portion of circuit 200 or not. However, as shown in FIG. 2B, the flood filler may add metal stripes to all open areas shown in FIG. 2A, regardless of whether minimum density rules are met.

Figure 3A:
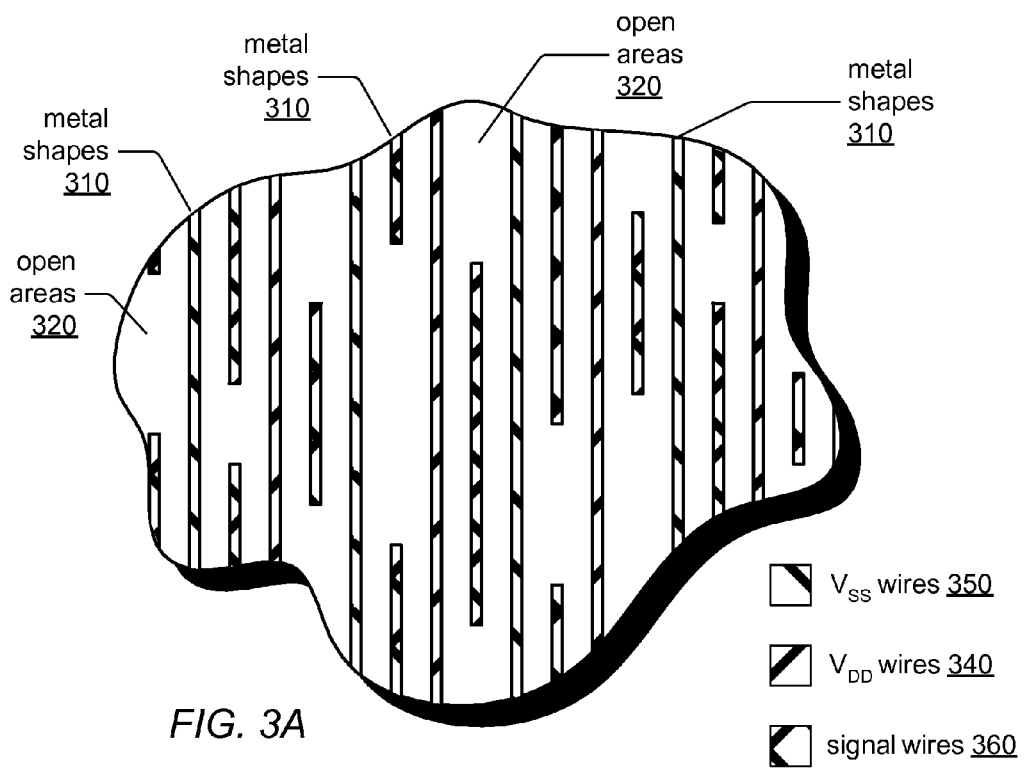
FIGS. 3A and 3B illustrate the use of a traditional flood filler.
Figure 3B:
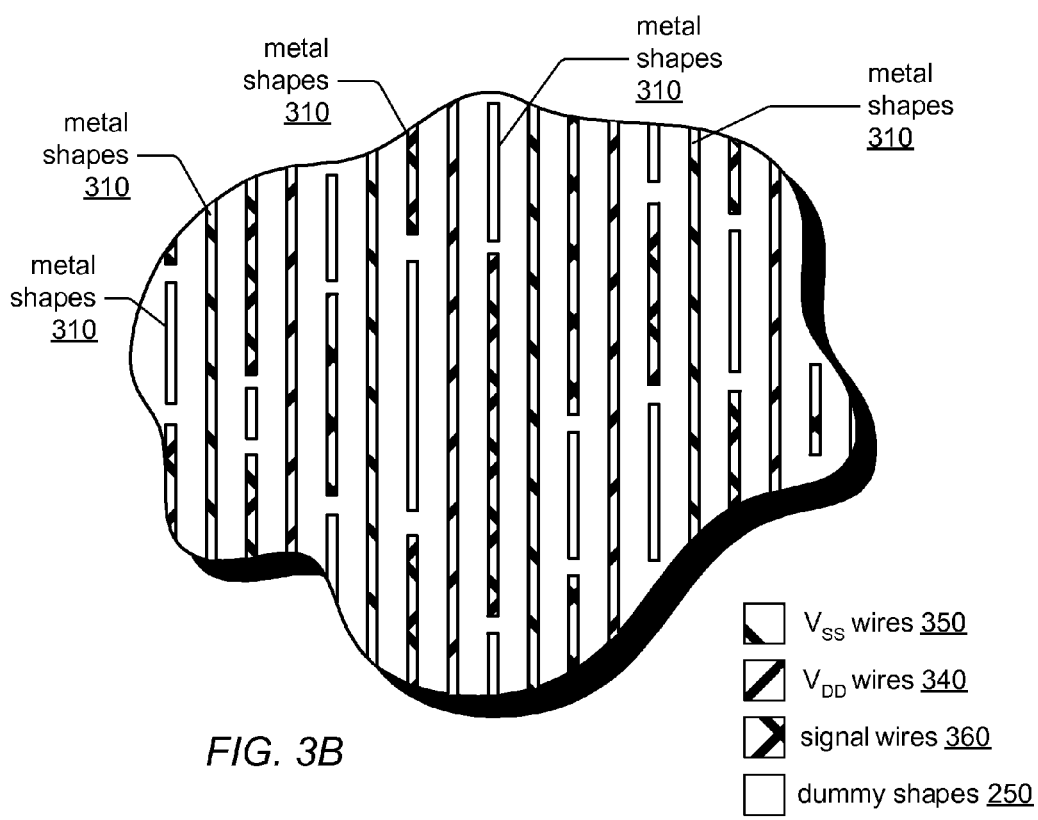

FIGS. 3A-3B illustrate another example of the use of a flood filler. In this example, a portion of a layout design representing one design layer (e.g., metal 1) is illustrated in FIG. 3A. As shown in FIG. 3A, this design layer includes a plurality of metal shapes 310 and several open spaces 320 in the area illustrated. These metal shapes may represent signal wires ((e.g., signal wires 360) or power lines (e.g., $V_{SS}$ wires 350 and $V_{DD}$ wires 340). A flood filler may add metal stripes to the design in order to fill the open spaces 320. The result is illustrated in FIG. 3B. As shown in FIG. 3B, additional metal shapes 310 (e.g., dummy shapes 250) were added to the design in each of the open areas 320, regardless of whether minimum metal density rules were met or violated in each of the open areas 320.

The system and method disclosed herein may be used to apply a density-based filler, rather than a traditional flood filler, to the layout of an integrated circuit design. The density-based filler may in some embodiments check for layer density violations first and may only fill those areas that do not meet certain density requirements. For example, the density-based filler may only add additional metal shapes to an open area of a given metal layer if the minimum metal density rule has been violated in the open area. In some embodiments, a density-based filler may be more efficient than a flood filler because it may not need to add as many shapes to the design. Therefore, the density-based filler may execute faster than a flood filler and/or may reduce the size of the design database produced as a result of the fill operation, in some embodiments. Because the resulting design may include fewer additional "dummy" shapes, use of a density-based filler may also reduce the time required to process the resulting design, such as in subsequent analysis steps. The resulting design may also have a higher manufacturing yield than a flood-filled design due to the design including fewer dummy shapes that may be susceptible to potential manufacturing marginalities.

In some embodiments, use of a density-based filler may reduce the risk of introducing other errors while correcting minimum density rules because fewer dummy shapes (each of which may potentially introduce a spacing, overlap, or other violation) may be added than when applying a traditional flood filler. In addition, the use of a density-based filler may in some embodiments reduce the risk of "overfilling" an area, since shapes may not be added to areas in which minimum density rules are already met. In some embodiments, the density-based filler may add shapes to a layer to correct minimum density violations and may also ensure that maximum density rules, spacing rules, and/or overlap rules for the layer are not violated when these shapes are added. In some embodiments, the use of the density-based layer filler may minimize the amount of work that needs to be performed by Optical Proximity Correction (OPC) tools, since violations of some OPC-related design rules may be avoided by construction when using the density-based layer filler.

The density-based filler described herein may access a configuration file from which specific spacing, width, and density rules may be extracted, in some embodiments. In some embodiments, the rules contained in the configuration file may be based on the process technology and/or the specific manufacturing process or facility that will be used to build the integrated circuit being designed. The type and complexity of the rules may vary widely depending on the technology, the limitations of the manufacturing process, the maturity/stability of the technology and/or manufacturing process, etc. These design rules may include a generic set of design rules for the technology as specified by the manufacturer, in some embodiments, and/or may include design-specific rules for the integrated circuit, which may be specified by the designer(s). In some embodiments, layer fill rules, including rules specifying the width and orientation of shapes to be added, may be provided by the manufacturer targeted to fabricate the integrated circuit.

The use of a configuration file may in some embodiments provide flexibility in applying the density-based layer filling tool, by allowing changes to be made easily as the technology matures (e.g., as its characteristics are better understood) and as the capabilities of the manufacturing facilities improve. In other embodiments, the use of a configuration file may allow a designer to more precisely target certain areas of the design for filling, taking into account the specific structures and features in the area. For example, the minimum allowable spacing between metal-filled areas and signal routing may be different than the minimum allowable spacing between two signal wires or between two metal-fill stripes. Similarly, the minimum allowable metal density may be different (or nonexistent) for the top-most metal layer than for one or more metal layers below the top-most layer. Therefore, in some embodiments, different rules may be applied to different layers. The configuration file may be used to specify very specific rules for how, when, and where to add fill shapes, dependent on these complex layer density rules and any other design-specific constraints or guidelines.

The inputs to the density-based filler described herein may include a layout database or streamed layout data, and one or more configuration files, in some embodiments. The density-based filler may add shapes on special dummy layers (e.g., a dummy metal layer specifying the purpose "fill"), according to some embodiments. In some embodiments, fill shapes may be added on the standard design layers or on "fill" layers, within a special structure (e.g., a "fill cell"). A fill cell may include any shapes added in order to correct minimum density violations and may in some embodiments be instantiated at the top-level of the design after the filler has been successfully executed.

Figure 4:
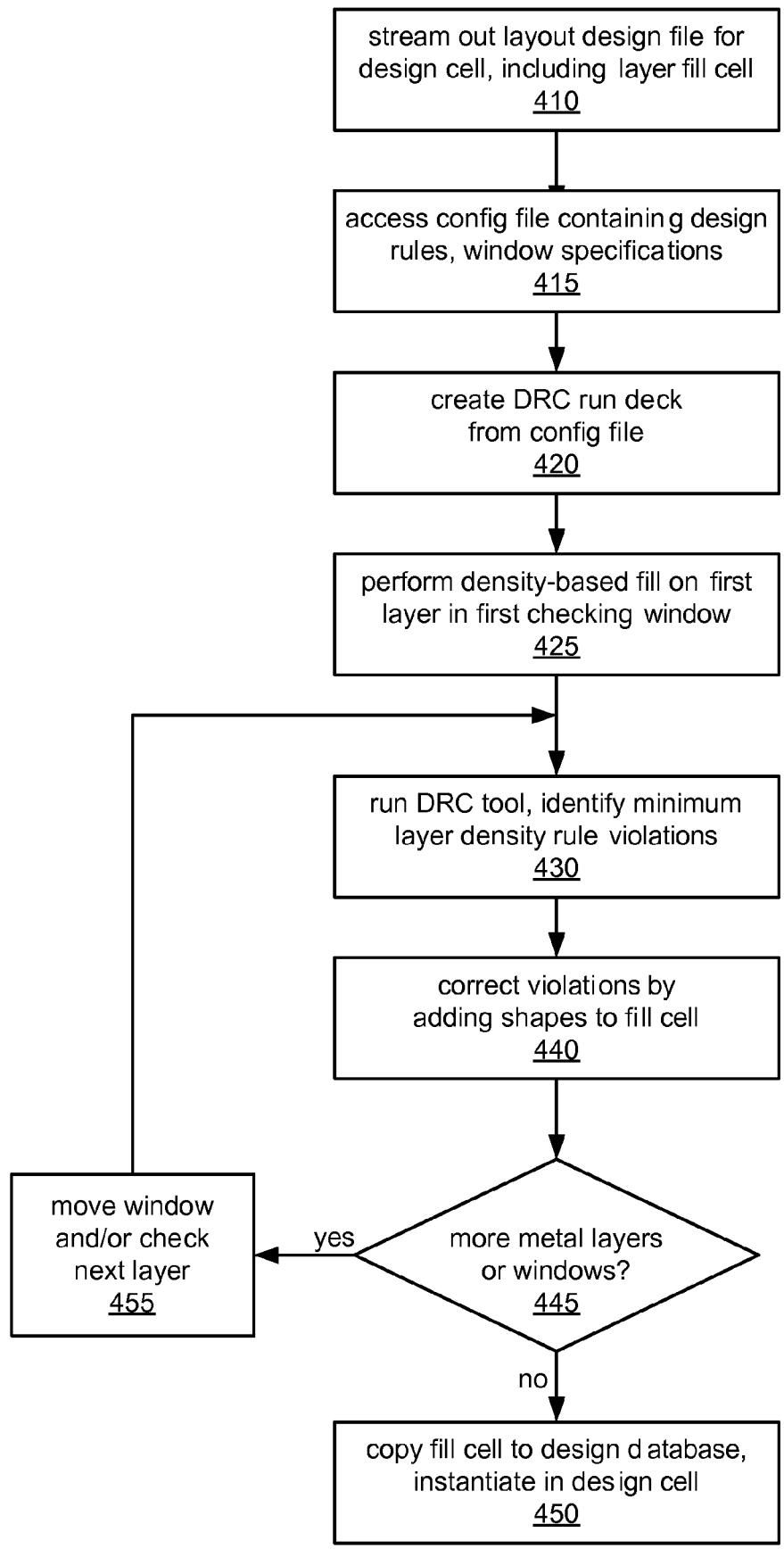
FIG. 4 illustrates a method for implementing density-based layer filling, according to one embodiment.

An example high-level flow for a density-based layer filler is illustrated in FIG. 4. In this example, a layout design representation (e.g., a GDSII representation) may be streamed from a layout editing or place and route tool, as in 410, in order to perform the fill operation. The layout representation may include data corresponding to an entire integrated circuit device, or to any portion thereof, according to different embodiments. For example, the layout data may represent the layout design for a CPU module of a microcontroller device or may represent the layout design for a portion of the CPU module contained within a functional, structural, or arbitrary boundary, or within a checking window. In some embodiments, layout data may be extracted from a database, such as a relational database, which stores design data. A fill cell may already exist for one or more of the layers to be filled, in some embodiments, and may also be streamed out or extracted from the layout database. In some embodiments, this fill cell may have been produced during a previous execution of the layer filler, while in others it may be a dummy (or empty) cell until it is populated by the layer filler the first time it is run on a design cell. In still other embodiments, a fill cell may be created by the layer filler when the layer filler is executed and the fill cell may not exist before the layer filler is executed.

In some embodiments, the density-based layer filler may access a configuration file, specifying design rules and checking windows for implementation of the filler. This is shown at 415 of FIG. 4. The configuration file may include minimum density rules for one or more layers of the target process technology/manufacturing facility combination. In some embodiments, the configuration file may also include minimum spacing rules, minimum width rules, minimum layer overlap rules, maximum layer density rules and/or any other design rules that may be usable by the density-based filler or a density-based fill flow. For example, in some embodiments, the density-based filler may add fill shapes in such a way that they are "correct by construction", i.e., such that they do not introduce violations of other design rules while correcting minimum density violations. In such embodiments, the configuration file may include the rules that will be taken into consideration when constructing and placing fill shapes. The contents of an exemplary configuration file, illustrated in FIGS. 10A and 10B, will be described in more detail later.

As shown in FIG. 4, a DRC run deck may be created based on the contents of a configuration file, as in 420. The run deck created at 420 may specify the layer or layers to be checked for minimum density violations and filled, and may extract and incorporate the rules for those layers from the configuration file into the program instructions in the run deck, in some embodiments. In some embodiments, the run deck may also specify the design cell or area on which to run the density-based filler. For example, the run deck may specify that the density-based filler will be run on a particular functional block or sub-block of the design, such as a CPU, timer, or communication module. In another embodiment, the run deck may specify an area to be checked and filled that is delineated by a boundary shape, i.e., defined by a shape on a boundary-purpose layer. A portion of an exemplary run deck is illustrated in FIGS. 11A-11E and will be described in more detail below.

The density-based layer filler may operate iteratively on a design by checking and filling a series of smaller portions of the design area defined by a moving "checking window", in some embodiments. As shown at 425, the layer filler may perform density-based filling on the first identified layer and using a first checking window. The checking window size may be specified in the configuration file, along with horizontal and vertical incremental step values, in some embodiments. The use of a moving checking window will be described in more detail later.

The density-based filler may execute a DRC function to identify minimum layer density rule violations using the generated run deck, as in 430. The DRC function may also check the design for violations of other rules and may be executed as part of the normal design flow, in some embodiments. In other embodiments, it may be executed by the layer filler specifically for the purpose of identifying density violations. The DRC function invoked may be a built-in function of a standard DRC tool, a custom function programmed for a standard DRC tool, or a stand-alone DRC function (i.e., a stand-alone software application) for identifying minimum layer density rule violations, according to various embodiments. In some embodiments, the DRC function may be invoked by a density-based layer filler that encapsulates several standard and/or custom EDA tools or their functionality to perform the operations described herein.

Once the areas failing minimum density rules for a given layer (and in the checking window) are identified, the density-based filler may in some embodiments add additional shapes to a dummy fill layer corresponding to the given layer and/or to a fill cell. This is illustrated at 440. These shapes may only be added in those areas identified as failing the minimum density rule for the given layer, in some embodiments. The shapes added to the given layer in the failing areas may include evenly-distributed stripes, or may be any other shapes constructed and placed so that they fill the failing area with enough additional area on the given layer to meet the density requirements in that area, according to different embodiments. As noted above, the added shapes may in some embodiments be constructed and placed so that they are "correct by construction", i.e., so that they do not introduce spacing, overlap maximum density, or other design rule violations when added to the design.

As illustrated at 445, once the first layer has been checked for density rule violations in the first checking window and any necessary corrections have been made, the density-based filler may have more checking windows in which to operate and/or more layers to check and fill. If so, the checking window may be moved to a new position and/or the filler may proceed to the next layer to be checked and filled. This is illustrated at 455. As illustrated in FIG. 4, the operations shown in 430-445 may be repeated until the density-based layer filler has been applied to all targeted design layers and in all applicable checking windows.

After the density-based filler has added shapes to the design for the targeted design layers, they may be copied to the design database and instantiated in the design cell, as shown in 450. As noted above, these fill shapes may be added to a fill cell and/or may be added to a dummy layer corresponding to a functional layer, but with a "fill" purpose, in different embodiments. In some embodiments, the standard violation reporting mechanism of the design rule checker being applied to the design may be used as a means to write out the added dummy fill shapes (e.g., metal fill shapes and associated vias) into one or more GDSII files. For example, metal fill shapes may be written to a file containing all shapes (original functional shapes and dummy fill shape) or the dummy fill shapes may be written to a separate file containing only dummy fill shapes. These GDSII files may in some embodiments be used as overlay cells for the original design in order to correct minimum density violations in previously open areas.

Although the example described above involves an iterative (serial) process for performing density-based layer filling, in other embodiments, density-based layer filling operations may be performed in parallel on different portions of a design or on different design layers. For example, if ten design layers are targeted for density-based layer filling, a top-level application may invoke ten different process threads, each of which may access a layer-specific configuration file and may operate on one design layer. These ten threads may execute in parallel, and the results may be merged by the top-level application when the individual threads complete execution. In another example, the design may be partitioned into functional blocks and a top-level application may spawn multiple execution threads on multiple machines, each operating on one of the functional blocks in parallel with the others. The results of these execution runs may then be merged by the top-level application. In this example, the top-level application may apply fill blockages to the individual functional blocks and may perform density-based layer filling on only the interfaces between the functional blocks at the top level of the design.

Figure 5A:
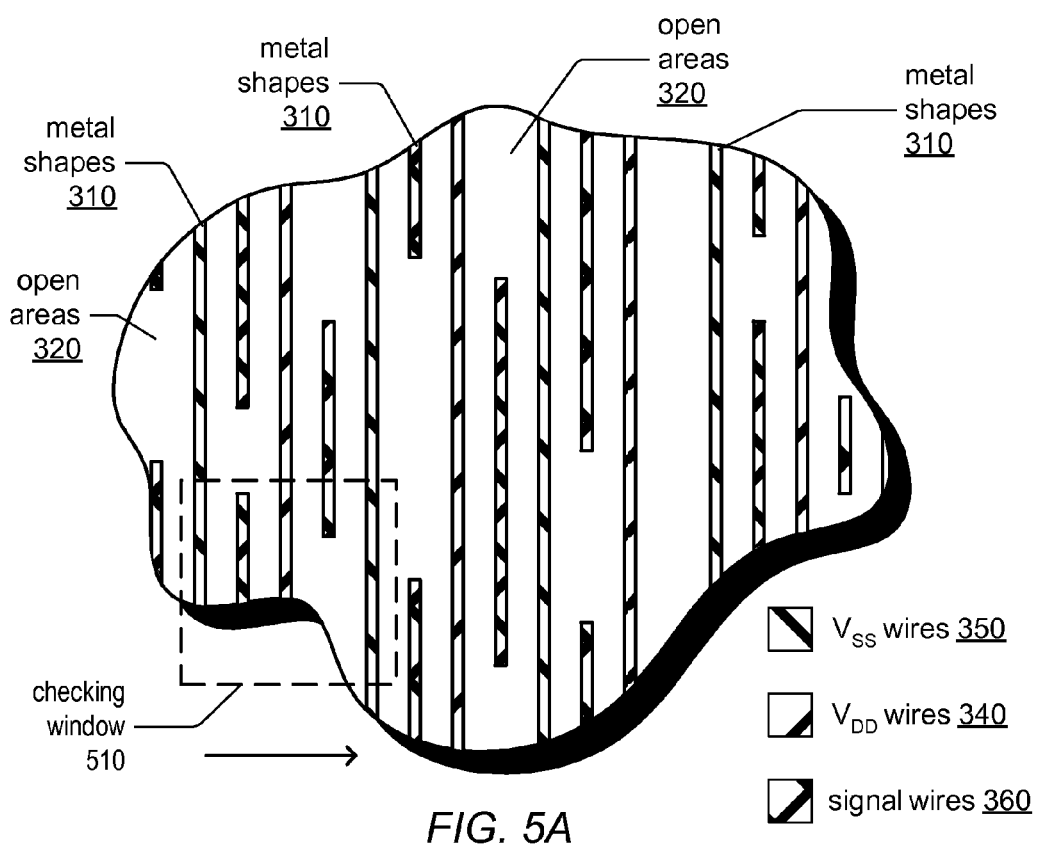
FIGS. 5A-5G illustrate the use of a density-based layer filler, according to one embodiment.
Figure 5B:
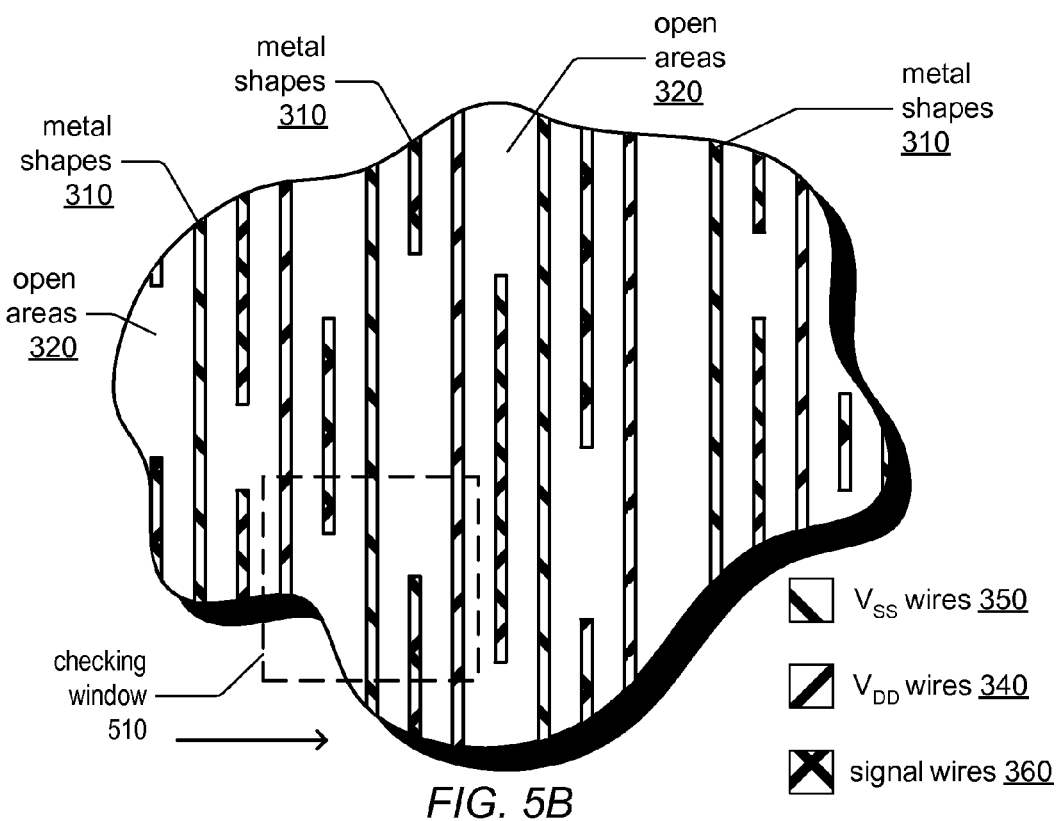
Figure 5C:
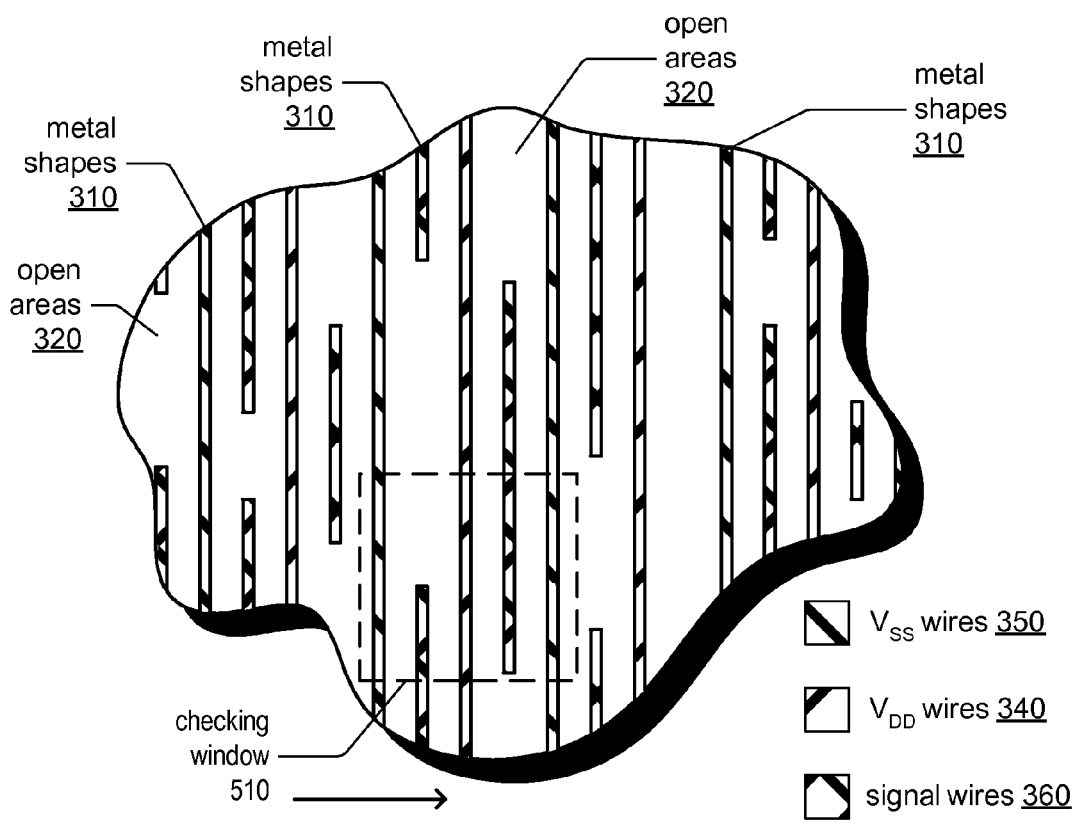

As described above, the density-based layer filler may be applied iteratively to different portions of a targeted design area according to one or more checking window sizes and step values. This is further illustrated by FIGS. 5A-5G. In this example, a density-based layer filler is applied to the portion of an integrated circuit design shown in FIG. 3A. FIG. 5A illustrates a first checking window 510, shown bounded by the dashed square, defining a first area that may be checked and filled during the first iteration described above. For example, the first checking window 510 may be 100 microns wide×100 microns high. FIGS. 5B and 5C illustrate the second and third iterations, respectively, as the checking window 510 is stepped horizontally across the design according to the horizontal step value corresponding to the layer/window size combination being checked. In this example the horizontal step value may be 20 microns. As previously noted, the window size and horizontal and vertical step values may in some embodiments be specified in the configuration file.

Figure 5D:
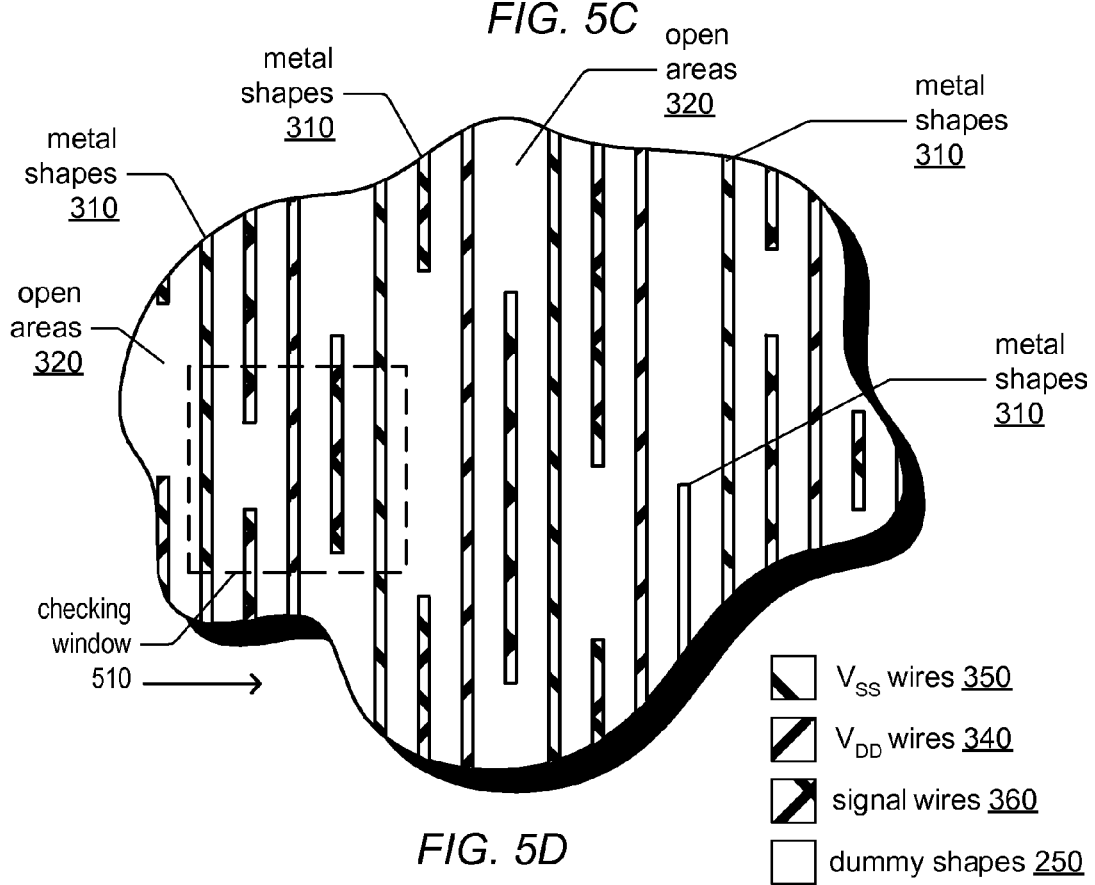

As shown in FIG. 5D, one or more additional metal shapes 310 (in this case, dummy shape 250) may be added in one of the open areas 320 if the density-based layer filler detects that the design does not meet minimum density rules in one of the checking windows 510 as it stepped across the design horizontally.

Figure 5E:
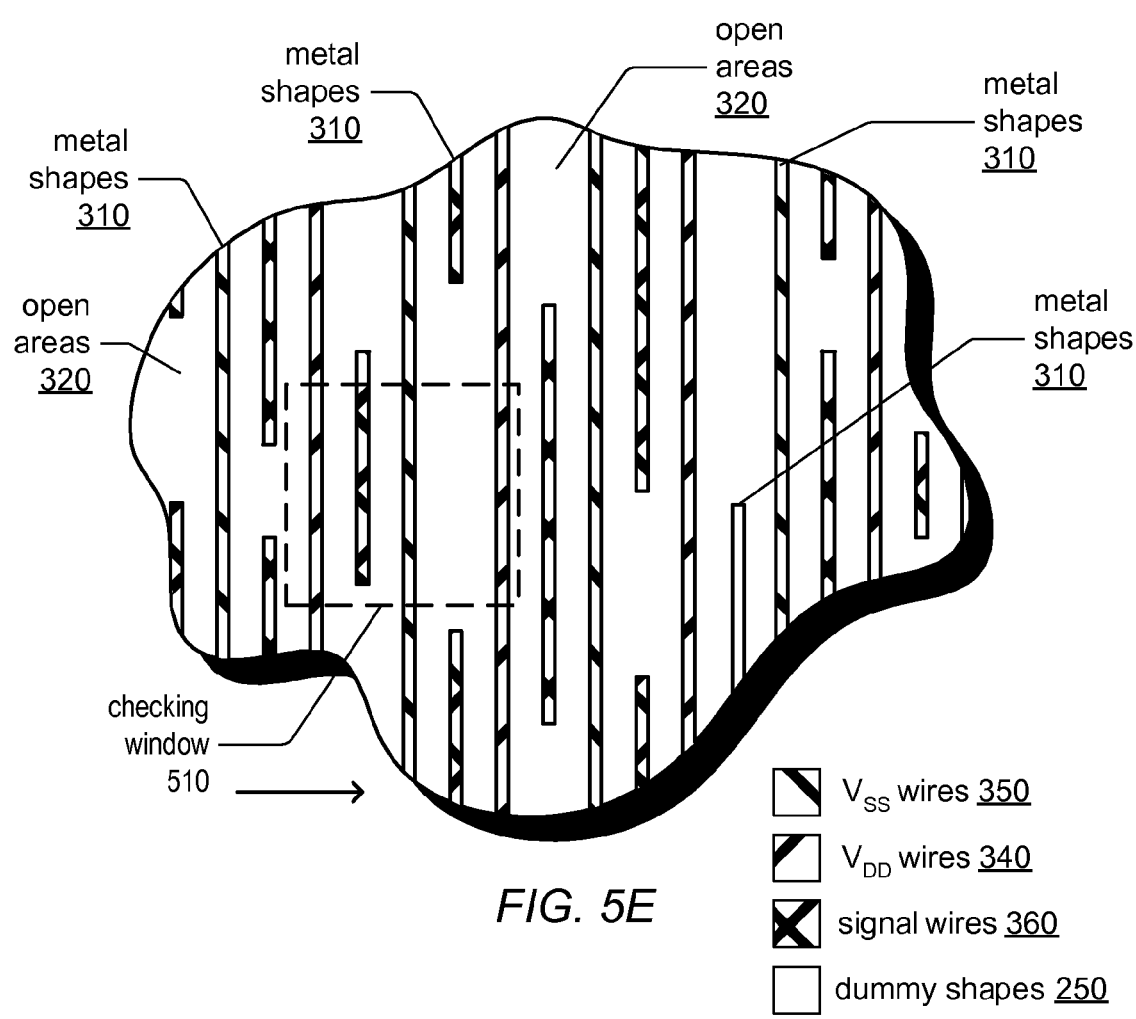

Once the checking window 510 has been stepped across the design horizontally, it maybe stepped vertically, in some embodiments. For example, FIGS. 5D and 5E illustrate the checking window 510 being stepped across the design horizontally, but at a next vertical position, according to the specified vertical step value. As shown in this example, the same size checking window (100 microns×100 microns) and horizontal step value (20 microns) may be used in these iterations, and a vertical step value of 20 microns may be applied to check the next portion of the design.

Figure 5F:
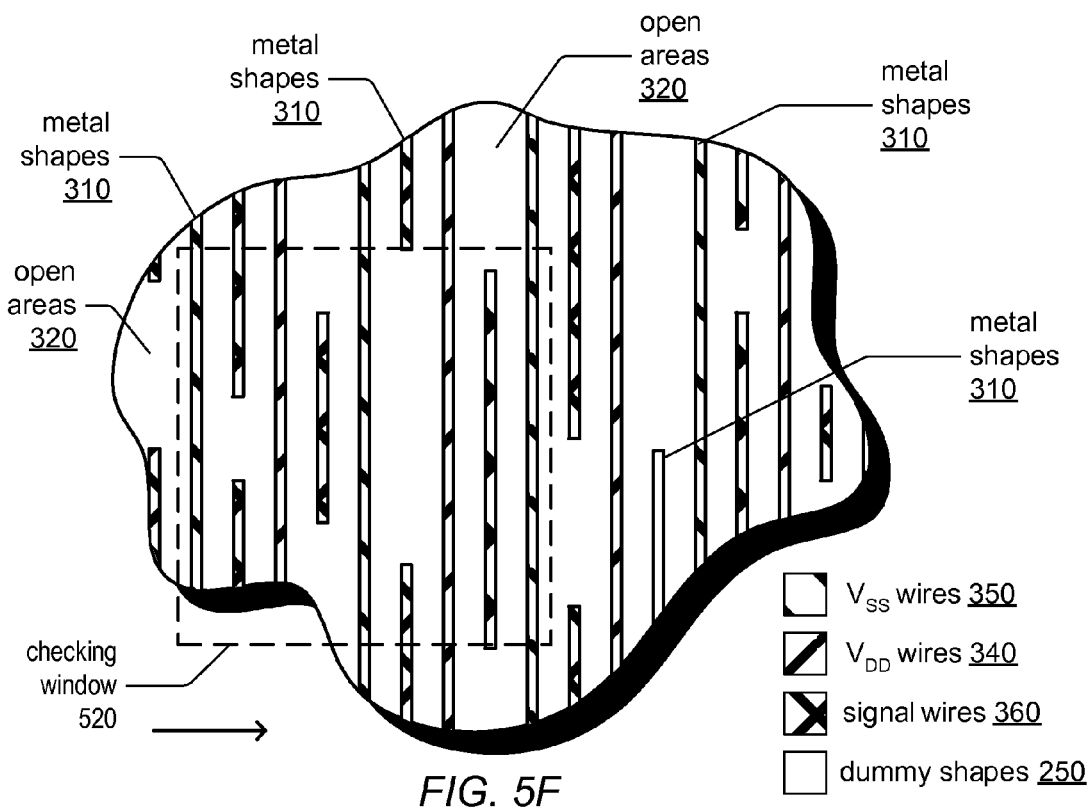
Figure 5G:
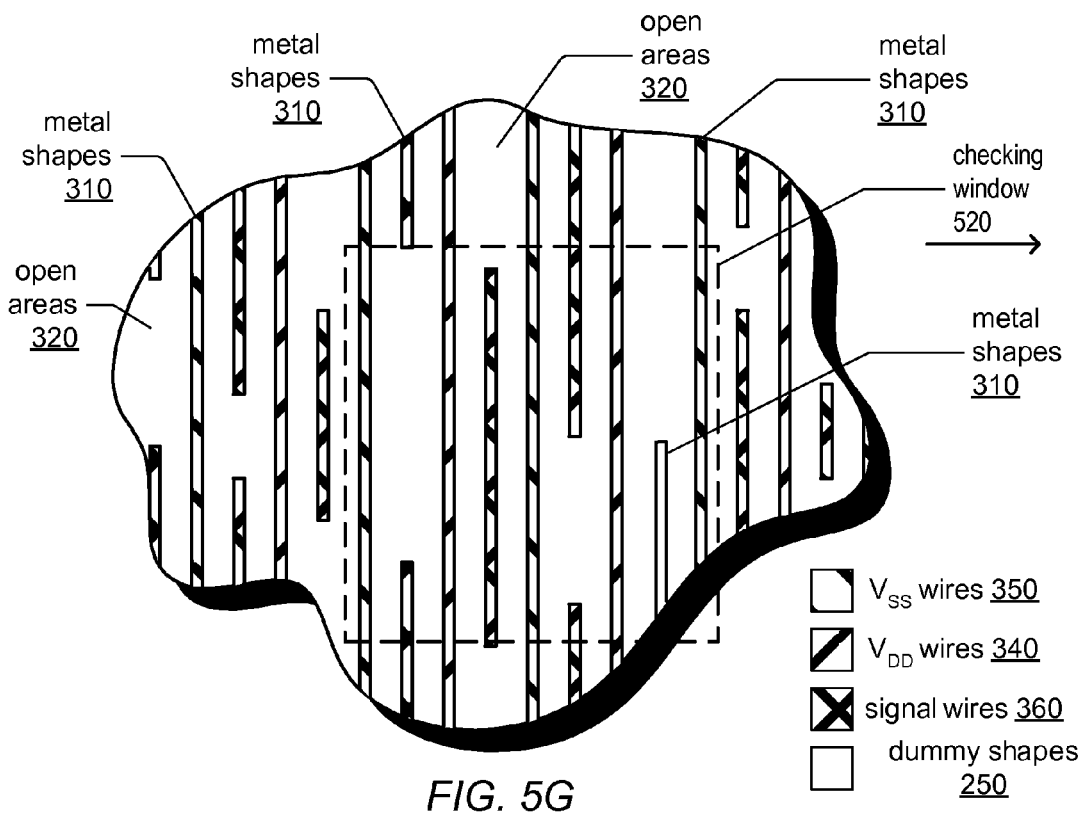

After the targeted design area has been checked and filled using a first window size, further iterations may be used to apply one or more other checking window sizes and step values to the checking and filling operations. For example, FIGS. 5F and 5G illustrate a second checking window 520, in this case a larger checking window. As shown, this larger checking window may be stepped across the design according to a different (in this case, larger) horizontal step value. In this example, the second checking window may be 250 microns wide and 250 microns high, and the horizontal and vertical step values may be 50 microns.

In some embodiments, the use of one or more moving checking windows of different sizes for iteratively applying a density-based layer filler may facilitate identification of areas failing minimum layer density rules that may not have been identified using a single density rule checking step or an iterative density rule check employing fixed window sizes and/or shapes. For example, the minimum density rules in a small area may be met, while the rules applied to a larger portion of the design may be different and may not be met. Conversely, the use of these checking windows may in some embodiments result in adding fewer fill shapes to a design than may be added using a flood filler, since fill shapes may only be added in areas where appropriate minimum density rules are not met.

While the example illustrated in FIGS. 5A-5G involves a square checking window and equal horizontal and vertical step values, a density-based layer filler may be applied in a checking window of any arbitrary size or shape and may apply horizontal and vertical step values of any size, whether they are the same or different, in different embodiments. In some embodiments, a density-based metal filler may operate on an entire design or functional design block, or may operate on any arbitrary area of the design designated by the presence of one or boundary shapes on one or more layers of purpose "boundary", rather than being applied iteratively to a targeted design area using one or more checking window stepped across the design.

In the examples illustrated in FIGS. 4 and 5, the density-based layer filler may add shapes to the layout design as each checking window is stepped across the design and minimum density violations are identified. In other embodiments, however, the density-base layer filler may not add any additional fill shapes to the design until minimum density violations have been identified in all applicable checking windows (e.g., using all window sizes and all checking window positions). In such embodiments, all the violations identified may be analyzed to determine a minimum number of fill shapes (and/or their optimum size/shape) to be added to the design to correct all (or a maximum possible number) of minimum density violations. In such embodiments, fewer fill shapes may be added to the design than in the examples illustrated by FIGS. 4 and 5, since redundant fill shapes may not be added. For example, a fill shape intended to correct a violation identified in a first checking window may not be added if a fill shape intended to correct a violation identified in a second checking window (e.g., a larger checking window) would also correct the violation identified in the first checking window. In another example, a single fill shape may be added to a design to correct multiple violations that is a different size and/or shape than any of the fill shapes that might have been added to correct the violations individually.

In an integrated circuit design, adding dummy shapes to a design layer without connecting them to any other features of the design may result in rule violations or may affect the parasitics of the design in undesirable ways. For example, adding a floating metal shape (i.e., a metal wire that is not connected to any signal or power wire) may increase the risk that the associated capacitance cannot be properly analyzed or may introduce other unintended effects.

The density-based filler described herein may in some embodiments implement interconnecting added fill shapes to each other and/or to other features in order to avoid rule violations and/or unwanted electrical effects due to adding the shapes. For example, in some embodiments interconnects may be established between added metal shapes and existing ground wires. In some embodiments, this may result in a design that does not contain floating features (e.g., floating metal).

Figure 6:
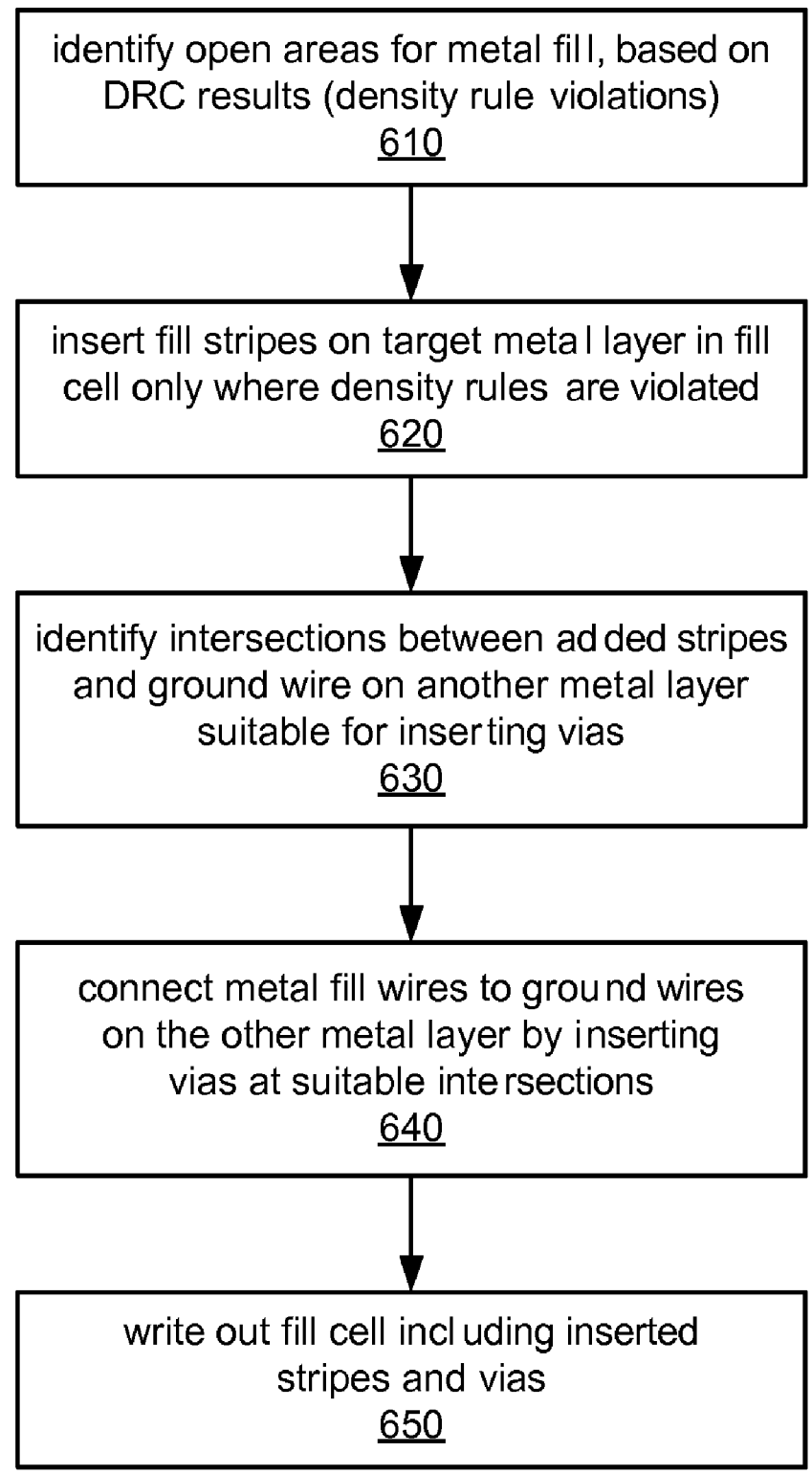
FIG. 6 illustrates one embodiment of a method for connecting fill shapes to existing ground wires.

One method for connecting metal fill shapes to existing ground wires is illustrated by the flow chart in FIG. 6. As shown at 610, open areas to be filled are identified based on DRC results. For example, open areas in which minimum metal density rules are violated may be identified by the density-based filler. As described above, fill stripes may be inserted on the target metal layer, such as in a fill cell, only where density rules are violated. This is shown at 620.

Connecting added fill shapes to a nearby ground wire may in some embodiments involve inserting vias in the design to connect the added shapes to the next lower or higher metal layer, at a point where they intersect. In some embodiments, after inserting the metal fill shapes, the density-based filler may identify suitable intersections between the inserted metal fill shapes and a nearby ground wire, as in 630. In some embodiments, an intersection may only be considered for via insertion if it is of rectangular shape, for example, and/or if it allows a completely enclosed minimum-size via to be placed in the intersection. In some embodiments, the edges of a rectangle defined by the intersection may need to coincide with the edges of the corresponding metal routes in order to be considered for via insertion. In other embodiments, insertion of overhanging and/or assymetric vias may be supported. In some embodiments, if a suitable intersection is not located for a given added fill shape, the shape may be removed.

Once suitable intersections are identified, the added metal fill wires may be connected to ground wires on the adjacent metal layer by inserting vias at the intersections, as in 640. In some embodiments, the identified intersections are filled with via arrays. In some embodiments, at most two suitable intersections may be used for via interconnects for each added metal wire to limit the number of vias added and the database size. In such embodiments, the two outermost suitable interconnects for a fill wire may be used. In some embodiments, if at least one suitable intersection cannot be found for connecting a given added metal wire to a ground wire, the added metal wire may be removed. Since it may not be possible to connect the lowest metal layer to a ground wire on a lower layer, the density-based layer filler may only attempt to connect added metal fill shapes on this layer to the adjacent metal layer above the filled layer, in some embodiments.

Once the added metal shapes are connected to existing ground wires, the added metal stripes and any added vias may be written out to the fill cell, as in 650. In some embodiments, the added metal stripes may be written out to the fill cell as they are inserted and only the added vias may be written out to the fill cell after the interconnections are made.

Figure 7:
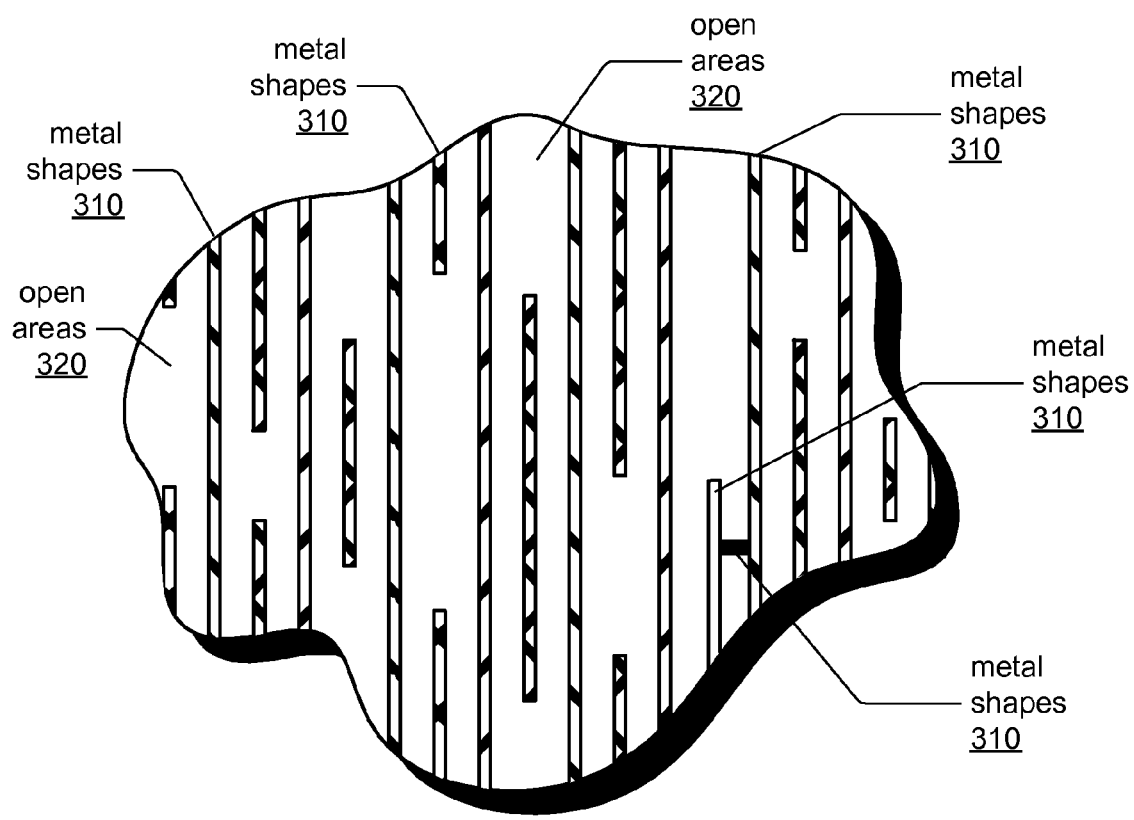
FIGS. 7 and 8 illustrate two different embodiments in which metal fill shapes are connected to existing ground wires.

Many modern integrated circuit designs require a substantial amount of power and may include a power distribution grid across all routing layers. In these designs, the density-based filler may "tap" into the existing grounded metal of the power grid in order to avoid floating metal fill shapes. In some embodiments, tapping into the power grid may further reduce runtime of the filler, since interconnecting dummy metal among different metal layers may not be needed. This is illustrated in FIG. 7. In this example, metal fill shapes added by a density-based layer filler may be connected to existing ground wiring on the same metal layer, rather than on a different metal layer. As shown in FIG. 7, dummy shape 250 is connected to an adjacent $V_{SS}$ wire 350 by adding a metal shape 310 (connection to $V_{SS}$ wire 750) between dummy shape 250 and $V_{SS}$ wire 350.

Figure 8:
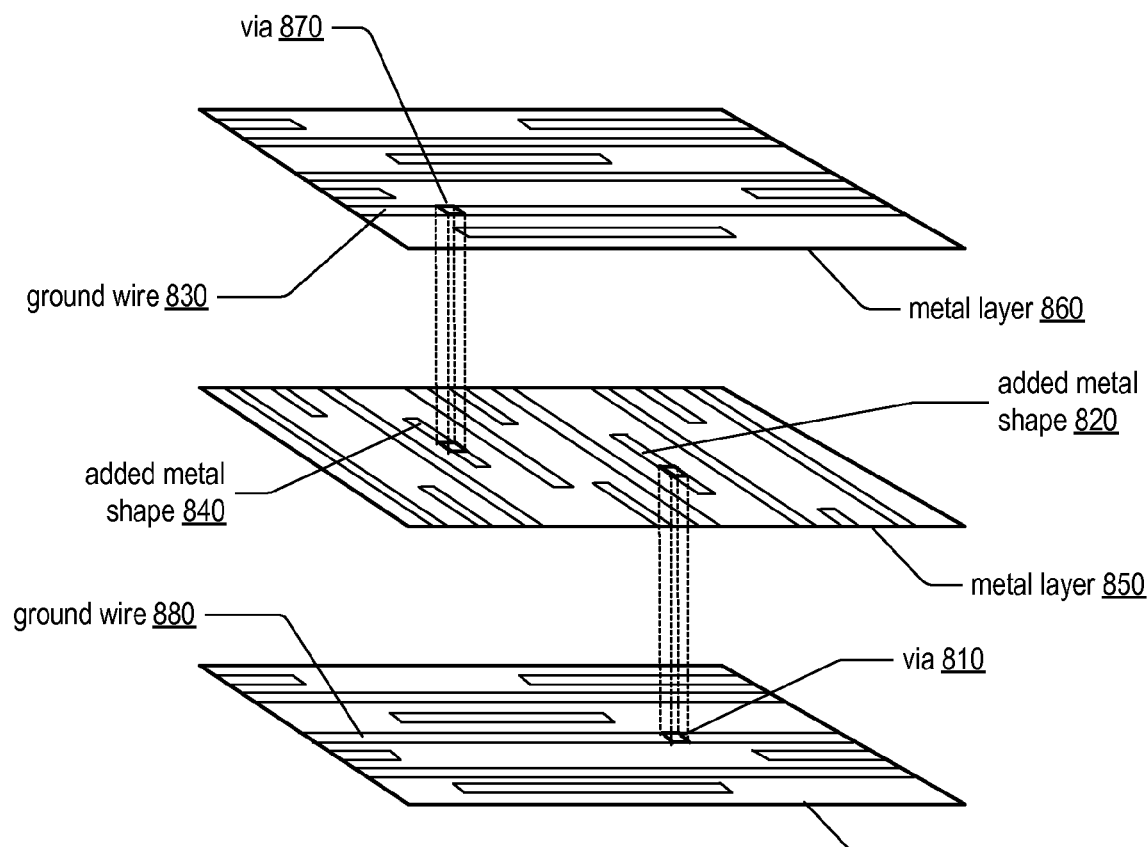

In some embodiments, the prevalent routing direction of the signal wires and/or power rails on one layer is perpendicular to the prevalent routing direction on adjacent layers. For example, routing may be predominantly horizontal for odd metal layer numbers (m1, m3, m5, etc.) and predominantly vertical for even metal layer numbers (m2, m4, m6, etc.). In such embodiments, the routing directions may be defined in the configuration file. Added metal fill wires may in some embodiments be placed in the same orientation as the predominant routing direction on the layer to be filled. One example in which the predominant routing on odd metal layers is perpendicular to that on even metal layers is illustrated in FIG. 8. In this example, metal layers 860 and 890 have a predominant routing direction perpendicular to the routing direction of metal layer 850. As shown in FIG. 8, added metal wire 820 on the middle metal layer 850 may be connected to a ground wire 830 on the topmost metal layer 860 by inserting via 870 to connect the two metal wires. In this example, another added metal wire 840 on metal layer 850 may be connected to a ground wire 880 on the lowest metal layer 890 by inserting via 810 to connect the two metal wires. In these examples, the individual metal fill shapes are connected to existing ground wires at intersection points between the fill shape and the ground wires on the adjacent ground wires.

In some embodiments, two or more metal fill shapes may be connected to each other and only one of the fill shapes may be connected at an intersection point to an existing ground wire. In some embodiments, dummy metal shapes on two or more different metal layers may be connected to each other and then one of the shapes may be connected to a ground wire on yet another metal layer. Connecting added fill shapes to each other and then to a ground wire or power grid may in some embodiments involve inserting additional metal shapes and/or vias in the design to connect the fill shapes together and then adding vias between one or more of the connected shapes to a ground wire on the next lower or next higher metal layer, at a point where they intersect. The density-based filler may automatically connect dummy shapes on metal layers or other layers together and/or may connect them all to the same potential (i.e., $V_{DD}$ or $V_{SS}$), in some embodiments.

In some embodiments, each combination of layer, window size, and step values may correspond to a different density rule value, while in other embodiments, a single layer density rule value may apply to two or more layers of a similar type (e.g., all metal layers) and/or to windows of two or more sizes. As illustrated in FIGS. 5A-5G, a density-based layer filler may in some embodiments iteratively check density rules for multiple window sizes and corresponding step values. For example, the filler may first check for density violations in a 100 micron×100 micron window stepped across the design in 20 micron increments, and then may check for density violations in a larger window, such as 500 microns by 500 microns, using a 50 micron step value. In some embodiments, different density rules may be applied to different window sizes. Checking for density rule violations in different sized windows may in some embodiments result in identifying density rule violations in an area of the design in which no violations were detected using a single-pass density checker.

In some embodiments, the density-based layer filler described herein may be applied hierarchically, e.g., using a bottom-up design approach. In such embodiments, a density-based layer fill may be performed on one design block, then if that design block is instantiated inside a bigger block, the area covered by the previously-filled block may already be correct by construction when the density-based layer filler is run on the bigger block.

Figure 9:
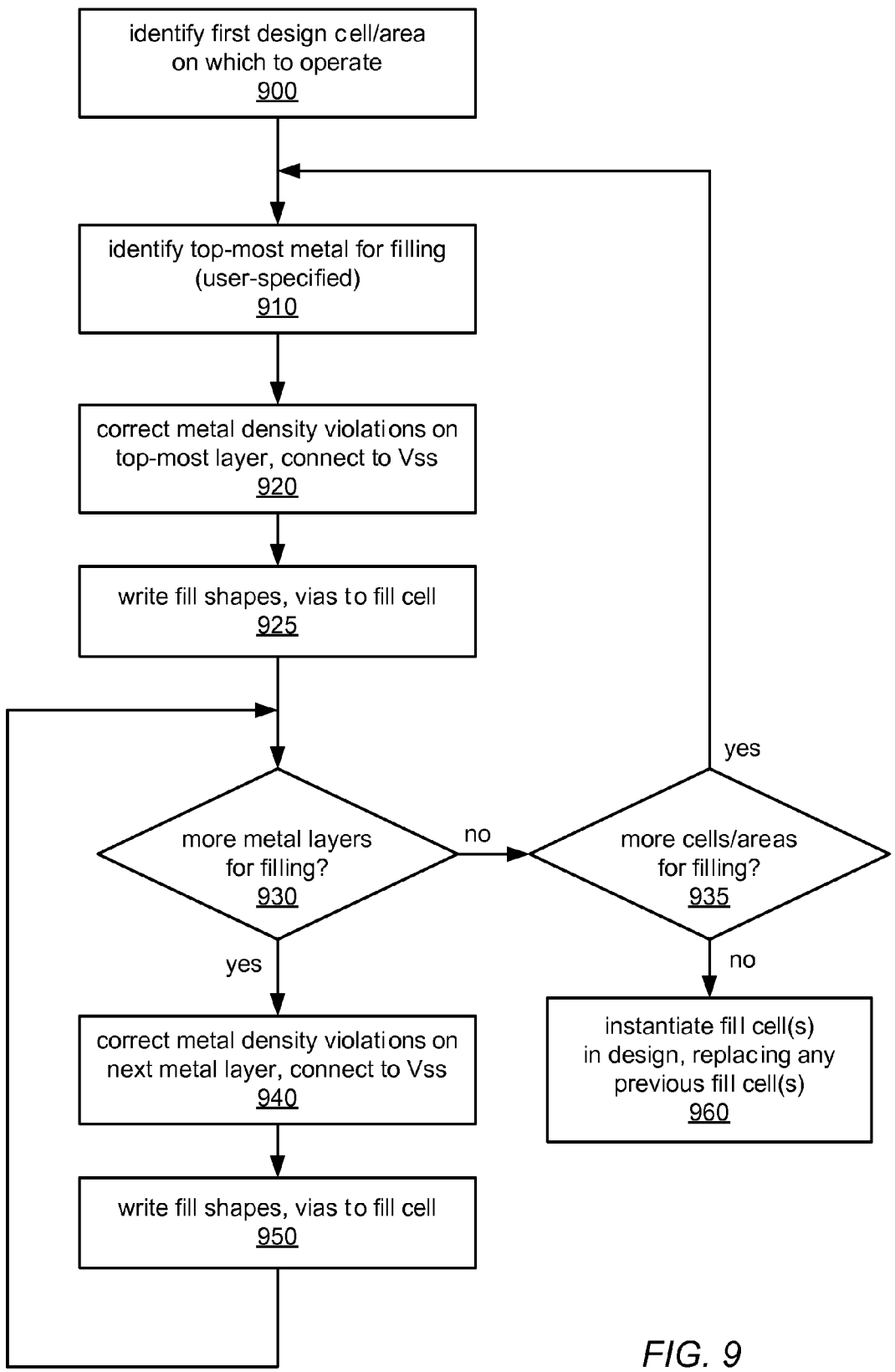
FIG. 9 illustrates a method for implementing density-based layer filling on multiple layers of an integrated circuit design, according to one embodiment.

One embodiment of a method for performing an iterative density-based layer fill is illustrated in FIG. 9. In this example, a first design cell or area on which to apply the density-based layer filler is identified, as in 900. Using a hierarchical approach, the first identified cell may be a functional block in the design, such as a timer, serial communication module, or load/store unit, in some embodiments. In other embodiments, the first area to which the density-based layer filler is applied may be an arbitrary portion of the design. This arbitrary area may be defined by a shape on a boundary layer and/or specified in a configuration file or run deck or may be specified by the user using a command line option, in different embodiments. In some embodiments, the design boundary is defined using a design layer purpose having a purpose "boundary", for example.

The density-based layer filler may be applied to the first layer in the first area using a first density rule corresponding to the first layer and one or more window sizes for the first layer to be filled, as specified by the configuration file. In the example illustrated by FIG. 9, the user may specify the top-most layer on which the density-based layer filler is to be run. This may be specified in the configuration file, in some embodiments, or by the user at run-time, in other embodiments. In the example illustrated by FIG. 9, the density-based layer filler may be applied to multiple metal layers using several different window sizes stepped across the area of interest. In this example, the user may specify the top-most metal layer for filling (as in 910) and the lowest metal layer to be filled may be assumed to be the lowest metal routing layer, typically metal 1.

The density-based layer filler may identify violations of minimum density rules for the first metal layer, may correct them by adding dummy metal fill shapes (e.g., in a fill cell) on the metal layer itself or on a fill purpose layer, and may connect the fill shapes to existing ground wires, as shown in 920 and as described herein according to various embodiments. The density-based layer filler may detect and correct density rule violations for the first layer in a first window size and may step this checking window across the design according to step values specified for the horizontal and vertical step increment, in some embodiments. In some embodiments, the density-based layer filler may then detect and correct density rule violations for the first layer in a second window size, using a second set of step values, and so on. At each iteration, the density-based layer filler may apply the density rules and window/step sizes specified in the configuration file for the first metal layer, in some embodiments.

Once the first metal layer has been filled according to the density rules and windows specified in the configuration file, the fill shapes and vias adding by the density-based layer filler may be written to the design database, as in 925. In the example illustrated in FIG. 9, these shapes and vias may be added to a design encoding for a special-purpose fill cell. In some embodiments, the fill cell may be drawn on the metal 1 layer itself, while in other embodiments, it may be drawn on a dummy layer with a purpose "fill" corresponding to metal 1.

Once the first metal layer has been filled, there may be more metal layers to fill. This is illustrated by the decision box at 930. If there are more metal layers to be filled, illustrated by the positive exit from 930, the density-based filled may be used to detect and correct density rule violations on the next metal layer, according to the density rules and/or windows specified in the configuration file for that metal layer, as in 940. Again, the fill shapes and vias added by the density-based filler may be written to the database as part of a fill cell, as in 950. As shown in FIG. 9, 930-950 may be repeated for all metal layers until the top-most metal layer specified at 910 has been filled.

Once all metal layers have been filled for the given design cell or area, as illustrated by the negative exit from 930, another design cell or area may be checked for density violations and fill shapes may be added to correct any violations identified. This is illustrated by the positive exit from 935. In some embodiments, the next design cell or area to be filled may correspond to a different design block at the same level of hierarchy as the first cell or area. In other embodiments, the next design cell or area to be filled may be a higher-level block, e.g., one in which the first block is instantiated. In still other embodiments, the design area to be checked may be defined by a shape on a boundary layer.

The density-based layer filler may iterate as many times as necessary to detect and correct density rule violations for the layers, areas, and windows specified by the configuration file and/or the user, in some embodiments. This is shown in FIG. 9 by the loops indicated for 930-940 and 910-935. Once all the specified filling has been completed, as indicated by the negative exit from 935, the fill cell(s) generated at 950 may be instantiated into the design database, as shown at 960. In some embodiments, these fill cells may replace any previous fill cells generated by the density-based layer filler. For example, as the design cycle progresses, density checking and correction of density rule violations may be performed at different stages, yielding different results. In some such embodiments, the results of older runs (e.g., the fill cell(s) generated by previous runs) may be discarded as the design is further refined.

The computer-implemented method illustrated in FIG. 9, may in some embodiments be integrated into existing steps of an integrated design flow (e.g., a DRC step) or may be implemented as a stand-alone tool applied to the design. For example, the density-based layer filler described herein may be executed as part of the DRC step (block 150) illustrated in FIG. 1. In some embodiments, the layer filler may be run on individual design blocks or clusters of blocks before their integration into a top-level integrated circuit design and then again on the top-level design following integration. In other embodiments, if the layer filler is successfully executed on all the lower-level design blocks, it may not be necessary to run it on the top-level design, as long as the top-level design is LVS and DRC clean following integration (i.e., as long as the added fill cells did not introduce an LVS or DRC error.)

In one embodiment, the design database may reside in DFII (e.g., in an Opus™ framework) and the flow may be managed through a SKILL™ wrapper, while the core of the flow may be implemented using the Calibre™ tool from Cadence Design Systems, Inc. In this embodiment, the input may be a Cadence design database, and the output may also be a Cadence design database, with any layer fill overlay cells instantiated. In this embodiment, the Calibre™ tool may execute based on a rule deck automatically generated by code in the SKILL™ wrapper. A shell wrapper may encompass the SKILL™ program to allow execution of the density-based layer filler from a command line, such as from a Unix command line, in some embodiments. In some embodiments, many operations of the density-based layer filler, such as identifying open areas for metal fill, filling in actual stripes, and connecting the metal stripes to $V_{SS}$ through vias may be performed within the Calibre™ tool and environment. In such embodiments, vias may be placed during Calibre™ operations.

The density-based layer filler described herein may in various embodiments be run at different points (or multiple points) in the design process. In some embodiments it may be preferable that the supplied (input) design be LVS clean in order to increase the chances of getting satisfactory results. In some embodiments, if an early look-ahead in a layout design with metal fill shapes is desired, it may be preferable to have at least the power supply be LVS clean. For example, in such embodiments, the design should not include any shorts between $V_{DD}$ and $V_{SS}$ or between any signal wires and $V_{SS}$ wiring.

In some embodiments, instantiating the density-based layer filler may include specifying the library and the cell name of the design to be filled. If a design view name is not also specified, the layout design view may be assumed.

As noted above, each layer may be processed using the same set of commands for each of the density checks specified in the configuration file through successive iterations. Each subsequent density check may be based upon existing metal and the metal fills created in the previous step, in various embodiments. In various embodiments, the configuration file may be implemented as a property list to be input to a DRC tool that includes density-based layer filling or to a stand-alone density-based layer filler. A portion of an exemplary configuration file is described in FIG. 10A. As illustrated in this example, the configuration file may include different density rule definitions, by layer, for each of a plurality of different window sizes and steps. As shown in FIG. 10A, each layer density rule in this example is defined by a density value, a window size (X and Y dimensions), and a step size (X and Y step values):

```
<layerDensity> ::=
(<densityValue> <windowSizeX> <windowSizeY> <stepX> <stepY>)
```

As shown in FIG. 10A, the configuration file may also define metal fill rules for each metal layer. In this example, each metal fill rule includes several layer rule definitions, each of which includes seventeen parameters. These parameters may be defined as follows:

- <routingDirection> specifies the prevalent routing direction. The letter h may be used for the horizontal routing direction and v for the vertical routing direction.
- <widestMetalMinSpacing> defines the minimum spacing required to the widest metal. This value may help identify the open space within which metal shapes can be placed without causing a wide-metal spacing violation between a fill wire and any metal outside that open space.
- <lowerViaMinMetal> defines the minimum size of metal that embeds a via down to the lower adjacent metal layer. This may be constructed of the via size plus twice the minimum metal enclosure value.
- <upperViaMinMetal> defines the minimum size of metal that embeds a via up to the upper adjacent metal layer. This may be constructed of the via size plus twice the minimum metal enclosure value.
- <minMetalArea> specifies the minimum metal area requirement.
- <minMetalSpacing> defines the minimum spacing required between fill wires.
- <lowerViaSquareSize> defines the square (i.e. width and height are identical) size of the via to the lower metal.
- <lowerViaSpacing> specifies the via-to-via spacing of the via connecting to the lower metal.
- <lowerMinMetalSizeForViaEnclosure> defines the minimum metal area size that allows a via to be placed down to the next adjacent metal layer without causing a DRC violation. If the minimum enclosure values differ between the layer in question and the metal layer below, the greater value may be used.
- <lowerMetalWideIntersectionRules> contains relevant entries if an intersection's size on the lower metal exceeds a certain threshold.
- <upperViaSquareSize> defines the square (i.e. width and height are identical) size of the via to the upper metal.
- <upperViaSpacing> specifies the via-to-via spacing of the via connecting to the upper metal.
- <upperMinMetalSizeForViaEnclosure> defines the minimum metal area size that allows a via to be placed up to the next adjacent metal layer without causing a DRC violation. If the minimum enclosure values differ between the layer in question and the metal layer above, the greater value may be used.
- <upperMetalWideIntersectionRules> contains relevant entries if an intersection's size on the upper metal exceeds a certain threshold.
- <metalGDSLayerNumber> is the GDSII layer number for the metal in question for stream out.
- <lowerViaGDSLayerNumber> is the GDSII layer number for vias connecting to the next lower metal.
- <upperViaGDSLayerNumber> is the GDSII layer number for vias connecting to the next upper metal.

In some embodiments, the configuration file may also include the definition of additional rules for intersections that exceed a certain size, for example:

<layerDensities>::=(<threshold><min WideEnclosure><minWideViaSpacing>)

In this example, the following definitions may apply to the additional rules:

- <threshold> defines the minimum metal width at which different via rules apply.
- <minWideEnclosure> specifies the minimum via enclosure that is required when the metal width threshold is exceeded.
- <minWideViaSpacing> specifies the minimum via spacing that is required when the metal width threshold is exceeded.

A portion of a configuration file following the definitions and format of the example illustrated in FIG. 10A is illustrated in FIG. 10B. In this example, the parameter values specified for metal 2 density rules are:

```
(m2 (
    (0.20 100.0 100.0 10.0 10.0)
    (0.25 500.0 500.0 25.0 25.0)
    (0.30 2000.0 2000.0 100.0 100.0)))
```

In this example, the minimum metal 2 density in a 100×100 window with a 10×10 step is 0.20, or 20%; the minimum metal 2 density in a 500×500 window with a 25×25 step is 0.25, or 25%; and the minimum metal 2 density in a 2000× 2000 window with a 100×100 step is 0.30, or 30%.

In the example illustrated in FIG. 10B, some metal layers (e.g., m1 and m2) have the same layer density rule parameter values as metal 2, while other metal layers (e.g., m3) have different layer density rule parameter values.

In the example illustrated in FIG. 10B, the parameter values specified for metal 2 layer rules are:
- v; routing direction (v for vertical)
- 0.50; min spacing for widest metal
- 0.20; min area within m2 that is required to enclose v2
- 0.20; min area within m1 that is required to enclose v1
- 0.050; min area requirement for m2
- 0.15; min m2-m2 spacing
- 0.15; square v1 size
- 0.15; v1 spacing
- 0.05; max of (min v1 enclosure on m1 or m2)
- (0.50 0.05 0.15); lower wide metal intersection rule specifies m2 width threshold;
- max of (min v1 enclosure on m1 or m2 for min of wide m1/m2); v1 spacing
- 0.15; square v2 size
- 0.15; v2 spacing
- 0.05; max of (min v2 enclosure on m2 or m3)
- (0.50 0.10 0.15); upper wide metal intersection rule specifies m3 width threshold;
- max of (min v2 enclosure on m2 or m3 for min of wide m2/m3); v2 spacing
- 22; m2 GDSII layer number
- 41; v1 GDSII layer number
- 42; v2 GDSII layer number The density-based layer filler may be controlled by a run deck, which in some embodiments may be generated based on the contents of the configuration file. The run deck may include a header section, a preprocessing section, and a layer filler section. The header section may in some embodiments include a standard set of commands specifying the run directory, the output database location, and a list of any cells that should be excluded from the layer filling. In some embodiments, the header section may be automatically generated by the layer filler.

The preprocessing section of the run deck may include a set of fixed run deck entries, in some embodiments. This section may include, in various embodiments, layer definitions for the target fabrication process and design methodology, including design layers, text layers, layer groupings, interconnectivity definitions, and the extent of the design to be checked. For example, the preprocessing section may include the following lines:

```
LAYER m1_in 21
LAYER m1txt 61
LAYER m1boundary 81
LAYER m1fill 141
LAYER v1 41
LAYER boundary 183
M1 = OR m1_in m1fill
ATTACH m1txt m1
CONNECT m11 m10 BY v10
CONNECT m1fill m1
data_extent = EXTENT boundary
m1_check = data_extent INTERACT m1
```

In this example, the first five entries shown define layer numbers for various design layers related to metal 1 and via 1. For example, design layer 21 may be the metal 1 layer included in the design before filling (m1_in), layer 61 may be the layer containing text related to metal 1 shapes (m1txt), layer 81 may define a boundary for the metal 1 layer in which the layer filler and/or other tools should be applied (m1boundary 81), layer 141 may be the layer on which fill shapes for metal 1 may be added (m1fill), and layer 41 may be the via 1 layer. In this example, layer 183 may be used to define a boundary for the design as a whole, rather than a boundary for an individual design layer.

The example above also defines a layer grouping, in which M1 is defined as the union (OR) of the metal 1 shapes in the input design (on layer m1_in) and the added metal 1 fill shapes (on layer m1fill). The next entry defines which text layer (m1txt) is associated with metal 1 (m1). Two lines define connectivity of design layers. For example, one entry defines design layer via 10 (v10) as the layer to be used when constructing vias for connecting shapes on metal 10 (m10) to shapes on metal 11 (m11), and the other entry defines a connection between shapes on the metal 1 fill layer (m1fill) and all other metal 1 shapes (m1). Finally, the last two lines specify the extent of data to be checked during a metal 1 fill operation.

The run deck preprocessing section represented by the example above may also include similar entries corresponding to design layers other than metal 1 and via 1. In addition, the preprocessing section of the run deck may include more, fewer, or different types of entries for each of a plurality of design layers, according to different embodiments. In some embodiments, the entries illustrated as being part of the run deck may be partitioned differently between a run deck and a configuration file, or may be distributed between several control files. In still other embodiments, some of the information included in the example above may be entered using a command line option, rather than through the configuration file, or a command line option may be used to override the contents of a configuration file.

Figure 11:
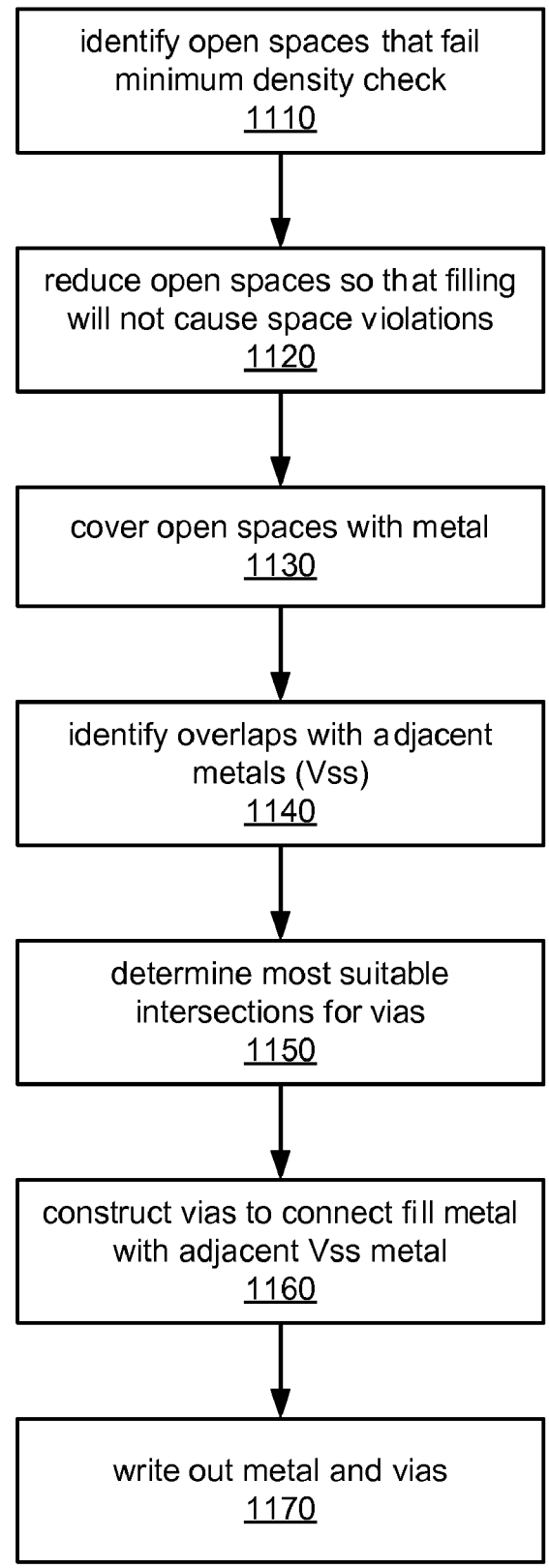
FIG. 11 illustrates a flow chart representing portions of an exemplary run deck of a density-based layer filler, according to one embodiment.

The layer filler section of a run deck may in some embodiments be generated by the layer filler from the contents of the configuration file and may include program instructions executable to perform the density-based layer filling operations described herein. FIG. 11 illustrates a flow chart representing portions of a run deck including program instructions executable to implement a density-based fill operation on the metal 2 design layer of an integrated circuit design, according to one embodiment. In this example, the code contained in the run deck may be prepared from a configuration file using Cadence SKILL™ code. In other embodiments a run deck may include commands generated and/or formatted according to another scripting language suitable for implementation of various EDA tools and/or their control and configuration files.

As shown in FIG. 11, for each design layer, the first step may be to identify areas that fail minimum density rules and (using geometric operations on the various shapes and layers) to identify the open spaces that should be filled, as in 1110. Exemplary program instructions suitable for implementing metal 2 density checking may include the following:

```
m2_failingDensity_r1 = DENSITY m2 no_data INSIDE OF LAYER
m2_check < 0.20
WINDOW 100.0 100.0 STEP 10.0 10.0 BACKUP
[(AREA(m2) + 0.20 * AREA(no_data)) / AREA( )]
m2_openSpace_r1 = m2_failingDensity_r1 NOT (m2 OR
(m2dbk OR m2boundary))
```

In the example program instructions above, a first minimum density rule for metal 2 is 20 percent for a checking window of 100×100 microns with vertical and horizontal steps of 10 microns. Open spaces to be filled (m2_openSpace) are defined as metal areas failing density rules, but not identified as being blocked for density checking (m2dbk).

Next, the area of the open spaces in which density checks fail may be reduced in order to construct appropriately sized dummy (fill) shapes, as in 1120. Program instructions for performing this operation may include the following:

```
m2_coverArea_r1 = SIZE m2_openSpace_r1 BY −0.50
```

In this example, the minimum spacing between metal 2 lines is 0.50. The value of 0.51 may be used in some embodiments to provide extra spacing of 0.01 over the nominal minimum spacing of 0.50 in order to allow construction of metal fill rectangles that will be placed in the next step during metal filling. In some embodiments, the tools may only allow rectangular shapes to be placed. Therefore, this margin may be needed for vertical growth of the rectangles in order to end up with horizontally oriented metal stripes.

The next steps, shown in 1130, may be to cover identified open spaces with rectangles and to grow the rectangles so that they merge with existing metal paths. Program instructions for performing these operation may include the following:

```
m2_coverRects_r1 = RECTANGLES 0.20 0.33 0.15 0.05 INSIDE OF LAYER
m2_coverArea_r1
m2_fillWires_r1 = SHRINK (GROW m2_coverRects_r1 BOTTOM BY 0.01 TOP BY 0.01) BOTTOM BY 0.01 TOP BY 0.01
```

As previously described, the density-based layer filler may be configured to automatically attempt to connect added fill wires (dummy shapes) to adjacent metals, such as ground wires. As shown in 1140, overlaps of the fill wires and adjacent metals (above or below the layer being filled) may be identified. In the case of metal 2 filling, overlaps with metal 1 $V_{SS}$ shapes and metal 3 $V_{SS}$ shapes may be identified. Program instructions for performing this operation may include the following:

```
m2_lowerOverlaps_r1 = AND m2_fillWires_r1 m1_vss
m2_upperOverlaps_r1 = AND m2_fillWires_r1 m3_vss
```

Once overlaps are located, program instructions in the run deck may be configured to determine the most suitable intersections for placing vias, as shown in 1150. In some embodiments, only rectangular overlaps may be considered suitable connection points and asymmetric vias may or may not be handled by the filler. In addition, in some embodiments, only full overlaps may be considered suitable connection points and partial overlaps may be disregarded to avoid redundant via problems. Full overlaps may be defined as those in which each metal extends beyond the corresponding edges (or touches the corresponding edges) of the intersection. In some embodiments, situations in which both layers run in the same direction may also not be regarded as suitable connection points, in some embodiments. Therefore, the next portion of the run deck may include program instructions to help reduce the number of added vias. Program instructions for performing this operation may include the following:

```
m2_lowerNotInter_r1 = m2_fillWires_r1 NOT m2_lowerRects_r1
m2_lowerOutside_r1 = m2_lowerNotInter_r1 INTERACT m2_lowerRects_r1 == 1
m2_lowerCover_r1 = m2_lowerRects_r1 TOUCH m2_lowerOutside_r1
m2_upperNotInter_r1 = m2_fillWires_r1 NOT m2_upperRects_r1
m2_upperOutside_r1 = m2_upperNotInter_r1 INTERACT m2_upperRects_r1 == 1
m2_upperCover_r1 = m2_upperRects_r1 TOUCH m2_upperOutside_r1
```

For example, in an ideal case in which there are numerous horizontal metal 1 paths crossing the fill wires on metal 2, the outermost two intersections may be selected for connections. If there are irregularities, such as partial overlaps with metal 1 or vertical metal 1 wires interacting with metal 2, more vias may need to be placed. However, using this method, the added via count may be significantly lower than in a case in which all intersections are filled with vias. Once these rules for selecting suitable intersections are applied, fill shapes that cannot be interconnected with existing metal may be removed, in some embodiments. Program instructions for performing this operation may include the following:

```
m2_remainingWires_r1 = INTERACT m2_fillWires_r1
(OR m2_lowerCover_r1
m2_upperCover_r1)
```

Note that in some embodiments, intersections of metal lines in different metal width classes may be operated on using different rules. In such embodiments, intersections of wide metal lines may be detected and separated from intersections involving standard width metal lines.

Once the fill shapes to be retained and suitable intersections have been identified for connecting them to $V_{SS}$, vias may be constructed at the intersections, as in 1160. Program instructions for constructing vias may be included in the run deck and may be implemented using various standard or custom via construction algorithms.

Finally, the remaining fill shapes and constructed vias may be written out to the layout database using the standard DRC reporting mechanism, as shown in 1170. In the example illustrated by FIG. 11, the remaining program instructions operating on metal 2 may implement constructing, merging, and writing out the added metal shapes and vias to the layout database, according to various standard or custom functions of the EDA tools being used to implement the design and/or the density-based layer filler.

In some embodiments, the file containing the layout representation of the design to be filled (e.g., the GDSII file created during design) may be read into a temporary library or layout database. After the density-based layer filler creates one or more fill cells containing fill shapes, they may be automatically copied into the original design in the library and instantiated on top of the original design cell, in some embodiments. In other embodiments, the fill layer shapes added by the density-based layer filler may be merged with the original layout design files to correct minimum density violations on the original design layers themselves. As noted above, in some embodiments if the density-based layer filler is re-run, the previously instantiated fill cell(s) may automatically be replaced.

As previously noted, a design may in some embodiments contain a design boundary that encompasses the area of the design to be filled, which may be represented as a shape on a design layer having a layer purpose of "boundary".

In some embodiments, to ensure that certain areas are not filled by the density-based layer filler, they may be "covered-up" using one or more designated fill blockage layers. Areas that are covered with regular boundary layers in abstracts, for example to block out routing, may in some embodiments be treated as having layer fill blockages as well. In such embodiments, blockages may be considered to represent 0% density, as the actual density is unknown. The layer-based layer filler may in some embodiments be applied to these portions of the design separately when they are complete. Later, when the layout design representations replace these abstracts (e.g., when the layout design representations are instantiated in the top-level design instead of the abstracts), the complete design may already be correct from layer density point of view.

In some embodiments, the areas having routing blockages may be included in layer fill operations (e.g., if a command line option specifies that these blockages should be ignored.) In some embodiments, via blockages may always be recognized, regardless of the use of a configuration file or command line option to ignore blockages. In some embodiments, layer fill blockages may be defined on different layer/purpose pairs than regular blockages (i.e., routing blockages). In some embodiments, via blockages may be defined on still other layer/purpose pairs.

Figure 12:
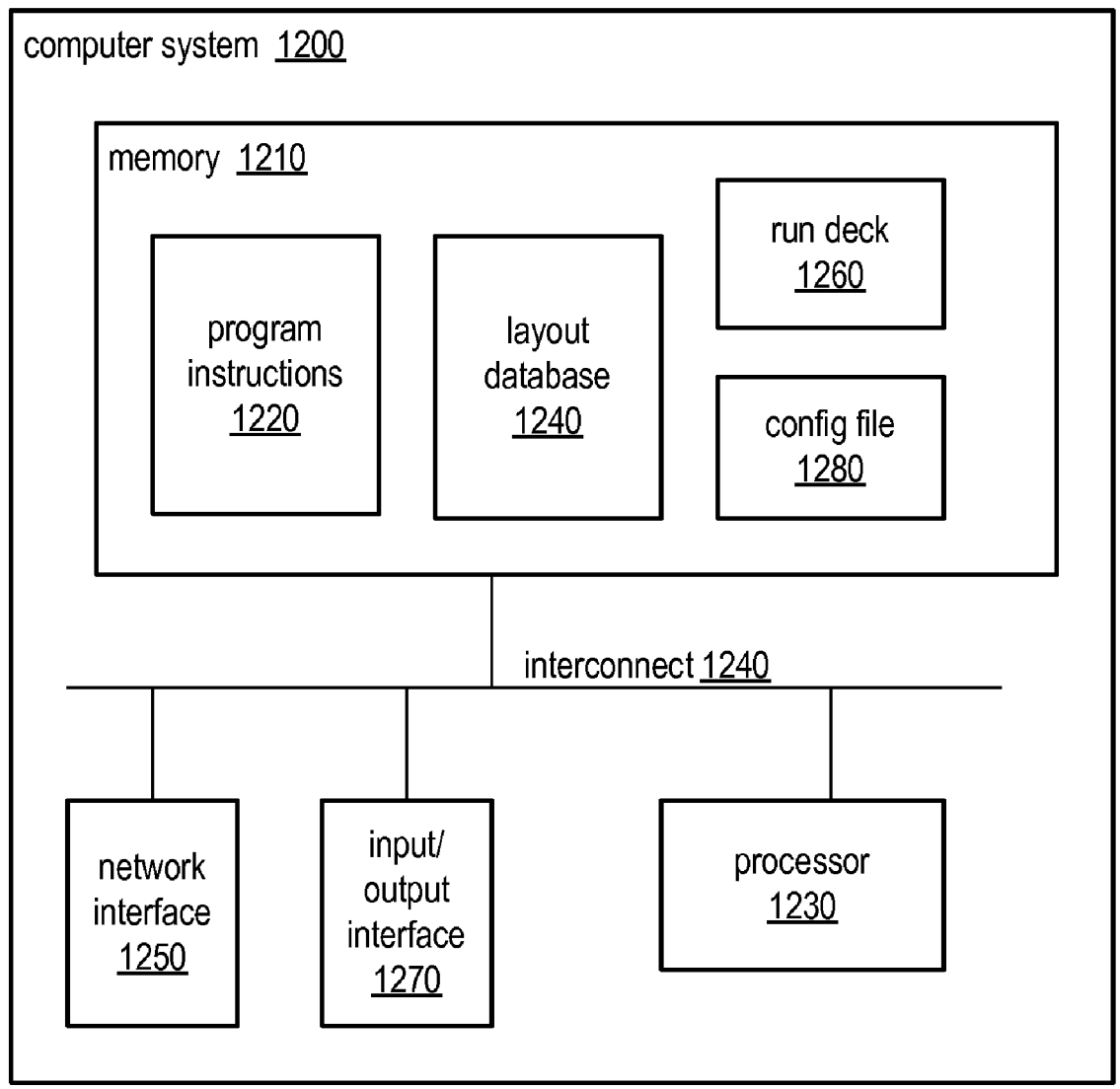
FIG. 12 illustrates a computer system suitable for implementing integrated circuit design using density-based design layer filling, according to one embodiment.

The density-based layer filler described herein may be implemented on various computer systems, according to different embodiments. For example, FIG. 12 illustrates one computer system suitable for implementing integrated circuit design using a density-based layer filler. Computer system 1200 may be one of any of various types of devices, including, but not limited to, a personal computer system, desktop computer, laptop or notebook computer, mainframe computer system, handheld computer, workstation, network computer, a consumer device, application server, storage device, a peripheral device such as a switch, modem, router, etc, or in general any type of computing device.

In the example illustrated by FIG. 12, computer system 1200 may include one or more processors 1230, interconnect 1240, one or more memories 1210, one or more network interfaces 1250 and one or more input/output interfaces 1270. In other embodiments, computer system 1200 may be partitioned into more or fewer components, or the components illustrated as being part of a single computer system 1200 may be distributed among two or more computer systems or nodes, according to various system configurations.

Processor 1230 may be configured to implement any of various instruction set architectures, such as x86, SPARC, PowerPC, etc. In some embodiments, processor 1230 may include a single CPU core, multiple CPU cores, or any combination of one or more general-purpose CPU cores and special-purpose cores (e.g., digital signal processors, hardware accelerators, co-processors, etc.) In various embodiments, processor 1230 may be configured to implement a superscalar architecture or may be configured to implement multi-threading.

In some embodiments, memory 1210 may contain program instructions 1220, layout database 1240, run deck 1260, and configuration file 1280. In other embodiments, program instructions 1220 and/or layout database 1240, run deck 1260, and configuration file 1280, may be stored in another type of computer-accessible medium, which may or may not be separate from computer system 1200. Examples of such computer-accessible media include, but are not limited to, installation media, e.g., a CD-ROM or floppy disk, computer system memory such as DRAM, SRAM, EDO RAM, SDRAM, DDR SDRAM, Rambus RAM, flash memory, etc., or non-volatile memory such as a magnetic media, e.g., a hard drive or optical storage. In some embodiments, program instructions 1220, layout database 1240, run deck 1260, and configuration file 1280 may be partitioned between memory 1210 and other memory.

Program instructions 1220 may be configured to implement the density-based layer filler described herein in conjunction with layout database 1240, run deck 1260, and configuration file 1280. These program instructions may be executed by processor 1230, in some embodiments. Program instructions 1220, layout database 1240, run deck 1260, and configuration file 1280 may be implemented using any of various programming languages or methods, according to various embodiments. Configuration file 1280 may in some embodiments include the elements and functionality of the configuration file for density-based layer filling described herein. Similarly, run deck 1260 may include the elements described herein for a density-based layer filler run deck, and may be generated according to configuration file 1280 and then stored in memory 1210.

In some embodiments, the functionality of program instructions 1220, layout database 1240, run deck 1260, and configuration file 1280 may be partitioned differently into more or fewer components than those illustrated in FIG. 12. For example, in some embodiments, configuration file 1280 may be stored in layout database 1240, along with layout data for the design. In another example, the functionality of run deck 1260 may be included in program instructions 1220, in some embodiments. In other embodiments, some or all of the program instructions and data to implement layout database 1240, run deck 1260, and configuration file 1280 may be located on a remote storage device accessible by computer system 1200, such as through network interface 1250.

Interface 1240 may couple processor 1230 to memory 1210, as illustrated. In some embodiments, interface 1240 may be configured to couple processor 1230 directly to a computer system network. In other embodiments, interface 1240 may be configured to couple processor 1230 to a network interface, such as a network interface 1250. In some embodiments, interface 1240 and input/output interface 1270 may be configured to implement one or more of various interface or network standards, e.g., Peripheral Component Interconnect (PCI), Ethernet, HyperTransport (HT), Infiniband, or any variant or successor of these or other suitable input/output protocols. In some embodiments, interface 1240 or input/output interface 1270 may incorporate some or all of the functionality of network interface 1250.

In some embodiments, the density-based layer filler described herein may be configured to perform a complete fill (i.e., a flood fill) by specifying a configuration file or command line option. Other configuration file and/or command line options may allow denser filling between lines of a rigid power grid or the use of an alternative power grid on a different metal layer than would normally be used by the filler. The success of the density-based layer filler in filling all open areas that fail to meet minimum layer density rules with sufficient fill shapes to correct the failure(s) may in some embodiments be dependent on the shape of open spaces. In some embodiments, it may also be dependent on the availability of suitable interconnection points to adjacent metal layers for ground connections, such as in the case of metal layer filling.

In some embodiments, the density-based layer filler described herein may include maximum density checks, as well as minimum density checks. In some such embodiments, if the added fill shapes cause the design to fail maximum density rules, some or all of the fill shapes may be removed. This may be done in a post-processing step or during the layer filling process, in different embodiments. In some embodiments, if the addition of layer density fill shapes introduces maximum layer density rule violations, the configuration file may need to be tuned for appropriate area filling, such as by adjusting the width of and/or the spacing among the fill shapes.

While many of the examples included above involve filling of metal layers and connecting the added fill shapes to existing ground wires, the methods described herein may be applied to other layers and to other structures for which density rules apply. For example, the density-based layer filler may be applied to a polysilicon design layer or an nwell layer. In these examples, it may not be necessary to ground the added fill shapes, so the operations involving locating a suitable intersection and constructing vias may in some embodiments be skipped. In another example, the methods described herein may be applied to checking and correcting violations of minimum density rules for vias, or for any other structures having minimum or maximum density requirements.

The design methodology described herein and illustrated in FIGS. 4, 6, and 9 may in some embodiments include more, fewer, or different operations, or may include more, fewer, or different feedback loops, according to various embodiments. It should be appreciated that although embodiments described herein include techniques executed by software modules, operations discussed herein may consist of commands entered directly by a computer system user, such as a user of computer system 1200, in some embodiments. The functionality of step referred to herein may correspond to the functionality of modules or portions of modules (e.g., software, firmware, or hardware modules), according to various embodiments. In addition to software modules, the above flows or portions of flows may, in some embodiments, be implemented as application instructions or menu items. For example, a function that performs identification of density rule violations on layout design data, as described herein, may be an application instruction provided by an EDA tool provider, according to some embodiments. In some embodiments, the software modules described herein may include script, batch or other executable files, or combinations and/or portions of such files. The flows described herein, and the operations thereof may be executed on a computer system configured to execute the operations of the flows and/or may be executed from computer accessible media, according to various embodiments. In some embodiments, the flows may be embodied in a machine-readable and/or computer accessible storage medium for configuring a computer system to execute the flows. In other embodiments, the software modules may be transmitted to a computer system memory to configure the computer system to perform the functions of the module.

The techniques described herein may be applied to an entire integrated circuit design or to portions thereof, according to various embodiments. For example, the layout database for each functional block or cell may be checked for density rule violations and those violations may be corrected using the density-based layer filler as that portion of the design is completed. Similarly, if one portion of the design is being reused from a previous (successfully fabricated) design, the density-based layer filler may not be applied to that portion of the design.

The techniques described herein may be applicable to and make use of any EDA tools, scripts, and design databases, which may be implemented in any code language, according to various embodiments. Moreover, although the above embodiments have been described in relation to integrated circuit design, the techniques described herein may be equally useful in the design of other electronic devices, for example in the design of a printed wiring board, in some embodiments.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A computer implemented method, comprising:
using a computer processor to perform:
accessing a configuration file, wherein the configuration file comprises:
a minimum density design rule for a design layer of an integrated circuit design layout, wherein the design layer comprises an encoded representation to be used in fabrication of the integrated circuit; and
an identifier specifying an area of the design layout on which to operate;
generating a run deck dependent on the configuration file, wherein the run deck comprises program instructions executable to perform a density-based layer filling operation on the area of the design layout specified by the identifier;
executing the program instructions comprised in the run deck to perform the density-based layer filling operation;
wherein the density-based layer filling operation comprises:
identifying a portion of the specified area of the design layout in which the minimum density design rule for the design layer is not met;
constructing one or more dummy shapes to be added on the design layer; and
inserting the one or more dummy shapes into the design layout only in the identified portion of the specified area;
wherein inserting the one or more dummy shapes results in the minimum density design rule for the design layer being met in the identified portion of the specified area.

2. The method of claim 1, further comprising:
- determining if said inserting the one or more dummy shapes into the design layout results in the design layout violating a maximum density design rule for the design layer; and
- in response to determining that said inserting the one or more dummy shapes into the design layout results in the design layout violating the maximum density design rule for the layer, removing at least one of the one or more dummy shapes.

3. The method of claim 1, wherein said constructing and said inserting comprise constructing and inserting the one or more dummy shapes such that a maximum density design rule for the design layer is not violated.

4. The method of claim 1, wherein said constructing and said inserting comprise constructing and inserting the one or more dummy shapes such that one or more other design rules involving the design layer are not violated, wherein the one or more other design rules are rules other than layer density rules, and wherein the one or more other design rules are specified in the configuration file.

5. The method of claim 1, further comprising:
for each of the one or more dummy shapes:
- identifying a suitable ground wire to which the dummy shape may be interconnected; and
- electrically connecting the dummy shape to the ground wire.

6. The method of claim 5, wherein said identifying a suitable ground wire to which the dummy shape may be interconnected comprises locating an intersection between the dummy shape and a ground wire on a nearest metal layer; and wherein electrically connecting the dummy shape to the ground wire comprises adding a via to the design layout to connect the design layer and the nearest metal layer at the intersection.

7. The method of claim 5, wherein said identifying a suitable ground wire to which the dummy shape may be interconnected comprises locating a ground wire on the design layer in the vicinity of the dummy shape; and wherein electrically connecting the dummy shape to the ground wire comprises inserting an additional shape on the design layer bridging a space between the dummy shape and the ground wire to electrically connect the dummy shape and the ground wire.

8. The method of claim 1, further comprising:
- interconnecting the one or more dummy shapes to each other, wherein interconnecting the one or more dummy shapes comprises inserting one or more additional shapes on the design layer each bridging a space between a pair of dummy shapes to electrically connect the one or more dummy shapes;
- identifying a suitable ground wire to which the interconnected dummy shapes may be connected; and
- electrically connecting at least one of the interconnected dummy shapes to the ground wire.

9. The method of claim 1, wherein said inserting the one or more dummy shapes into the design layout comprises:
- adding a representation of the one or more dummy shapes to a design file comprising layout data corresponding to a dummy layer; and
- merging the layout data corresponding to the dummy layer with layout data corresponding to the design layer.

10. The method of claim 1, wherein said inserting the one or more dummy shapes into the design layout comprises adding a representation of the one or more dummy shapes to a design file comprising layout data corresponding to the design layer.

11. The method of claim 1, wherein said identifying a portion of the specified area of the design layout in which the minimum density design rule for the design layer is not met comprises:
- iteratively applying a minimum density rule check to successive sections of the specified area defined by a checking window as the checking window is stepped horizontally and vertically across the specified area until the minimum density rule check indicates that the minimum density rule is not met; and
- in response to the minimum density rule check indicating that the minimum density rule is not met, identifying the section of the specified area in which the minimum density rule is not met;
- wherein horizontal and vertical dimensions of the checking window are specified in the configuration file and are specific to the minimum density rule; and
- wherein the checking window is stepped across the specified area according to horizontal and vertical step values comprised in the configuration file and specific to the minimum density rule.

12. The method of claim 1, wherein the design layer is a metal layer.

13. A computer implemented method comprising:
using a computer processor to perform:
- iteratively applying a minimum density rule check for a design layer of an integrated circuit design layout to successive sections of the design layout defined by a checking window as the checking window is stepped horizontally and vertically across the design layout until the minimum density rule check indicates that the minimum density rule is not met; and
- in response to the minimum density rule check indicating that the minimum density rule is not met:
  - identifying the section of the design layout in which the minimum density rule is not met;
  - constructing one or more dummy shapes to be added on the design layer; and
  - inserting the one or more dummy shapes into the design layout only in the identified section of the design layout;
- wherein said inserting the one or more dummy shapes results in the minimum density design rule for the design layer being met in the identified section of the design layout;
- wherein the design layer comprises an encoded representation to be used in fabrication of the integrated circuit.

14. The method of claim 13, further comprising:
- identifying a section of the design layout in which a second minimum density design rule for a second design layer is not met;
- constructing one or more dummy shapes to be added on the second design layer; and
- inserting the one or more dummy shapes into the design layout only in the identified section of the design layout in which the second minimum density rule is not met.

15. The method of claim 13, further comprising:
- iteratively applying a second minimum density rule check for the design layer to successive sections of the design layout defined by a second checking window as the second checking window is stepped horizontally and vertically across the design layout until the second minimum density rule check indicates that the second minimum density rule is not met; and
- in response to the second minimum density rule check indicating that the second minimum density rule is not met:

identifying the section of the design layout in which the second minimum density rule is not met;

constructing one or more dummy shapes to be added on the design layer; and inserting the one or more dummy shapes into the design layout only in the identified section of the design layout in which the second minimum density rule is not met;

wherein said inserting the one or more dummy shapes results in the second minimum density design rule for the design layer being met in the identified section of the design layout;

wherein the second minimum density rule differs from the minimum density rule in at least one of the following parameters: a horizontal dimension of the checking window, a vertical dimension of the checking window, a horizontal step value of the checking window, a vertical step value of the checking window, and a minimum density requirement.

16. The method of claim 13, wherein said constructing and said inserting comprise constructing and inserting the one or more dummy shapes such that one or more other design rules involving the design layer are not violated.

17. The method of claim 13, wherein parameters of the minimum density design rule comprise: a horizontal dimension of the checking window, a vertical dimension of the checking window, a horizontal step value of the checking window, a vertical step value of the checking window, and a minimum density requirement; and wherein the parameters of the minimum density design rule are specified using one or more of: a configuration file, a command line option, and a menu selection.

18. A system, comprising:

a processor; and a memory coupled to the processor;

wherein the memory comprises program instructions executable by the processor to implement:

accessing a configuration file, wherein the configuration file comprises:

a minimum density design rule for a design layer of an integrated circuit design layout, wherein the design layer comprises an encoded representation to be used in fabrication of the integrated circuit; and an identifier specifying an area of the design layout on which to operate;

generating a run deck dependent on the configuration file, wherein the run deck comprises program instructions executable to perform a density-based layer filling operation on the area of the design layout specified by the identifier;

executing the program instructions comprised in the run deck to perform the density-based layer filling operation;

wherein the density-based layer filling operation comprises:

identifying a portion of the specified area of the design layout in which the minimum density design rule for the design layer is not met;

constructing one or more dummy shapes to be added on the design layer; and inserting the one or more dummy shapes into the design layout only in the identified portion of the specified area;

wherein inserting the one or more dummy shapes results in the minimum density design rule for the design layer being met in the identified portion of the specified area.

19. The system of claim 18, wherein the memory further comprises program instructions executable by the processor to implement:

for each of the one or more dummy shapes:

identifying a suitable ground wire to which the dummy shape may be interconnected; and electrically connecting the dummy shape to the ground wire.

20. The system of claim 18, wherein to identify a portion of the specified area of the design in which the minimum density design rule for the design layer is not met, the memory further comprises program instructions executable by the processor to implement:

iteratively applying a minimum density rule check to successive sections of the specified area defined by a checking window as the checking window is stepped horizontally and vertically across the specified area until the minimum density rule check indicates that the minimum density rule is not met; and in response to the minimum density rule check indicating that the minimum density rule is not met, identifying the section of the specified area in which the minimum density rule is not met;

wherein horizontal and vertical dimensions of the checking window are specified in the configuration file and are specific to the minimum density rule; and wherein the checking window is stepped across the specified area according to horizontal and vertical step values comprised in the configuration file and specific to the minimum density rule.

* * * * *